United States Patent
Datta et al.

(10) Patent No.: US 9,864,950 B2
(45) Date of Patent: *Jan. 9, 2018

(54) COMPACT IMPLEMENTATION OF NEURON AND SYNAPSE WITH SPIN SWITCHES

(71) Applicant: Purdue Research Foundation, West Lafayette, IN (US)

(72) Inventors: Supriyo Datta, West Lafayette, IN (US); Brian Sutton, West Lafayette, IN (US); Vinh Quang Diep, West Lafayette, IN (US); Behtash Behin-Aein, Campbell, CA (US)

(73) Assignee: PURDUE RESEARCH FOUNDATION, West Lafayette, IN (US)

(*) Notice: Subject to any disclaimer, the term of this patent is extended or adjusted under 35 U.S.C. 154(b) by 322 days.

This patent is subject to a terminal disclaimer.

(21) Appl. No.: 14/609,359

(22) Filed: Jan. 29, 2015

(65) Prior Publication Data

US 2015/0269478 A1 Sep. 24, 2015

Related U.S. Application Data

(60) Provisional application No. 61/933,290, filed on Jan. 29, 2014, provisional application No. 62/014,883, filed on Jun. 20, 2014.

(51) Int. Cl.
*G06N 3/063* (2006.01)
*G11C 11/54* (2006.01)
(Continued)

(52) U.S. Cl.
CPC .............. *G06N 3/063* (2013.01); *G11C 11/16* (2013.01); *G11C 11/161* (2013.01);
(Continued)

(58) Field of Classification Search
CPC .......... G06N 3/06; G06N 3/063; G11C 11/16; G11C 11/54; H01L 43/08; H01L 43/04; H03K 19/20; H03K 19/16
(Continued)

(56) References Cited

U.S. PATENT DOCUMENTS

2005/0104119 A1* 5/2005 Diorio .................. H01L 27/115
257/315
2012/0176154 A1* 7/2012 Behin-Aein ........... H03K 19/16
326/37
(Continued)

OTHER PUBLICATIONS

Behin_Aein et al., "Modeling circuits with spins and magnets for all-spin logic", IEEE 2012.*
(Continued)

*Primary Examiner* — Dave Misir
(74) *Attorney, Agent, or Firm* — Purdue Research Foundation

(57) ABSTRACT

A neuron and synapse implementation is disclosed which incorporates a circuit element that includes first and second nanomagnets and first and second fixed magnets. The first nanomagnet is inductively coupled to a first current carrying element, and is configured to change polarity responsive to current in the first current carrying element. In one example, the first current carrying element includes a spin Hall effect substrate. The second nanomagnet is magnetically coupled to the first nanomagnet, and is inductively coupled to a second current carrying element. The first fixed magnet is disposed on the second nanomagnet and has a first fixed polarity, and second fixed magnet disposed on the second nanomagnet and has a second fixed polarity.

20 Claims, 21 Drawing Sheets

(51) Int. Cl.
*G11C 11/16* (2006.01)
*G11C 11/18* (2006.01)

(52) U.S. Cl.
CPC ...... *G11C 11/1673* (2013.01); *G11C 11/1675* (2013.01); *G11C 11/18* (2013.01); *G11C 11/54* (2013.01)

(58) Field of Classification Search
USPC .......................................................... 706/33
See application file for complete search history.

(56) References Cited

U.S. PATENT DOCUMENTS

| | | | | |
|---|---|---|---|---|
| 2014/0001524 | A1* | 1/2014 | Manipatruni | H01L 43/08 257/295 |
| 2014/0139265 | A1* | 5/2014 | Manipatruni | H03K 19/16 326/101 |
| 2014/0269035 | A1* | 9/2014 | Manipatruni | G11C 11/1675 365/158 |
| 2015/0200003 | A1* | 7/2015 | Buhrman | G11C 11/18 365/158 |
| 2016/0042778 | A1* | 2/2016 | Manipatruni | G11C 11/18 365/66 |
| 2016/0173100 | A1* | 6/2016 | Nikonov | H01L 29/66984 326/38 |

OTHER PUBLICATIONS

Srinivasan et al., "All-Spin Logic Device With Inbuilt Nonreciprocity", IEEE Transactions on Magnetics, vol. 47, No. 10, Oct. 2011.*
Sharad et al., "Spin-Based Neuron Model With Domain-Wall Magnets as Synapse", IEEE Transactions on Nanotechnology, vol. 11, No. 4, Jul. 2012.*
Diorio et al., "Adaptive CMOS: From Biological Inspiration to Systems-on-a-Chip", Proceedings of the IEEE, vol. 90, No. 3, Mar. 2002.*
Kucic et al., "Programmable and Adaptive Analog Filters using Arrays of Floating-Gate Circuits", IEEE 2001.*
Diorio, C., et al., A Single-Transistor Silicon Synapse. IEEE Transactions on Electron Devices, vol. 43, No. 11, 1972-1980, 1996.
Low, A., et al., Basics of Floating-Gate Low-Dropout Voltage Regulators. Proceedings 43rd IEEE Midwest Symp. on Circuits and Systems, pp. 1048-1051. Lansing MI, Aug. 8-11, 2000.
Srinivasan, V., et al., Floating-Gates Transistors for Precision Analog Circuit Design: An Overview. 48th Midwest Symposium on Circuits and Systems, IEEE, vol. 1, pp. 71-74. Covington, KY, Aug. 7-10, 2005.

* cited by examiner

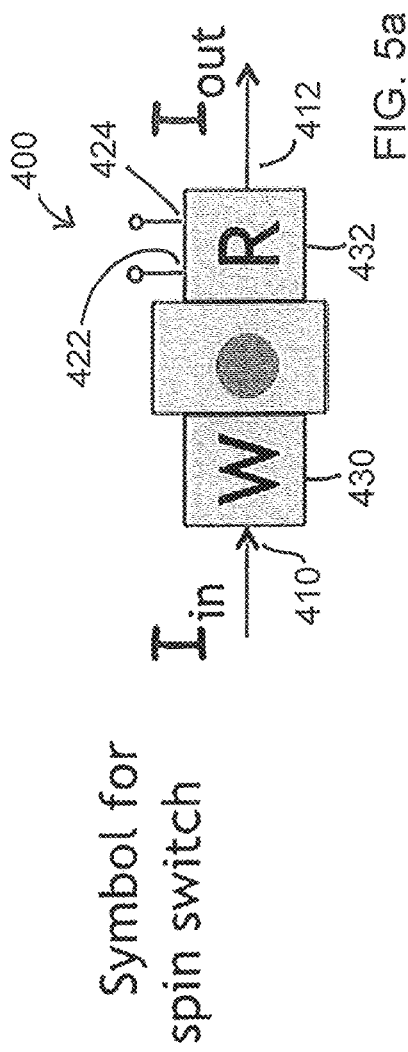
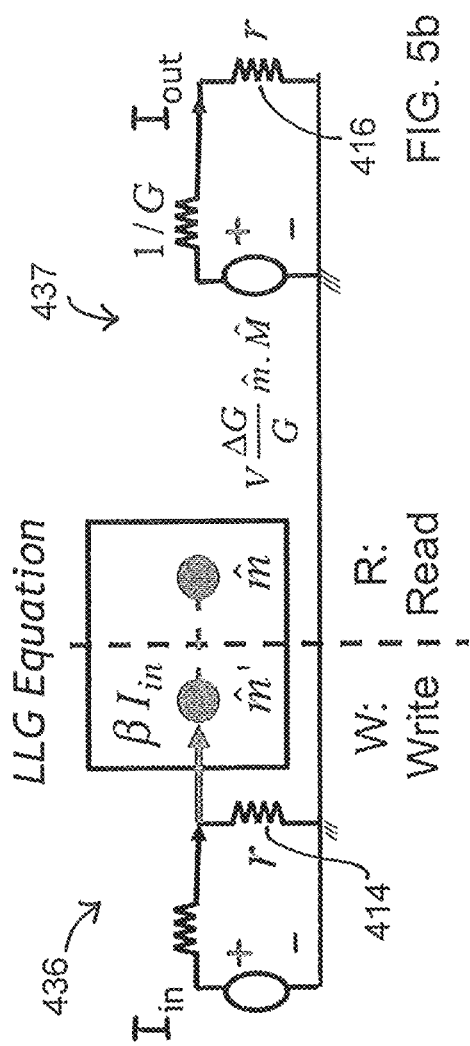
FIG. 5a
FIG. 5b

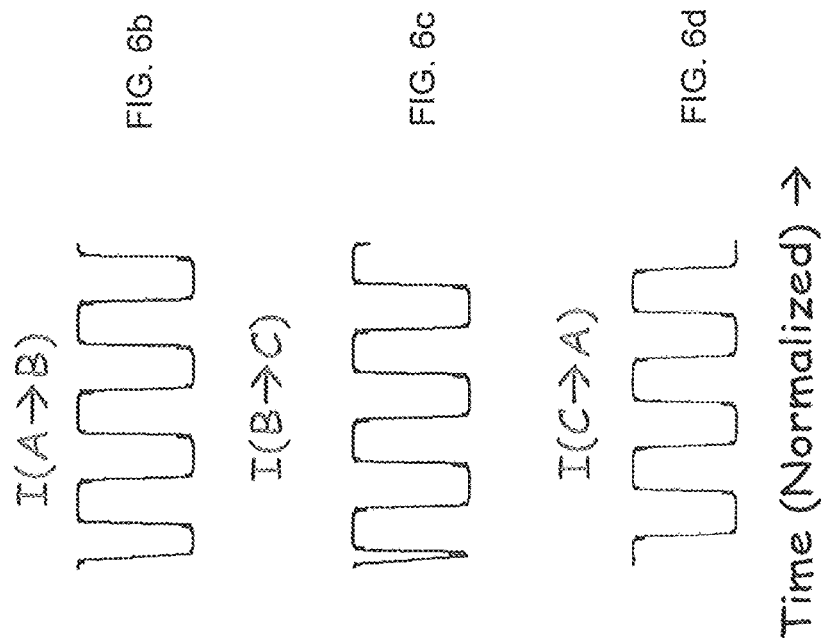
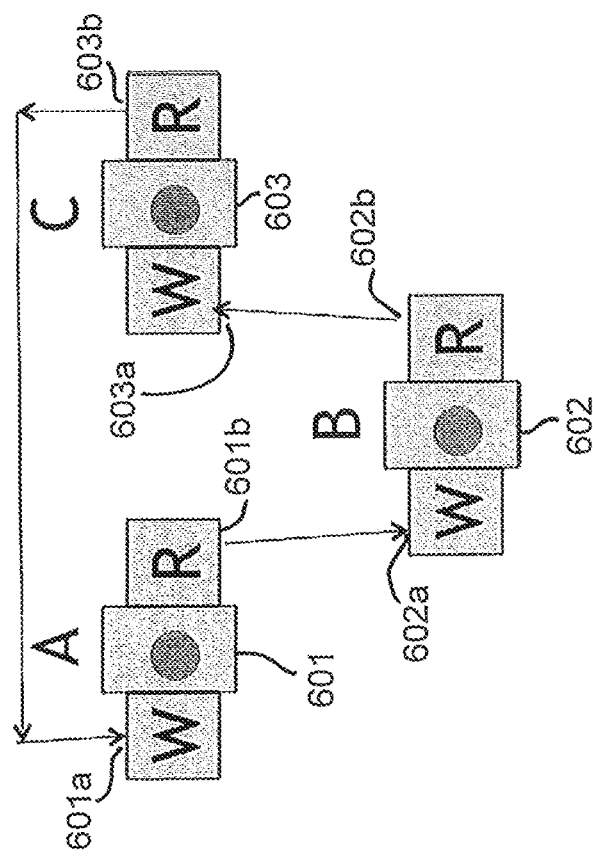

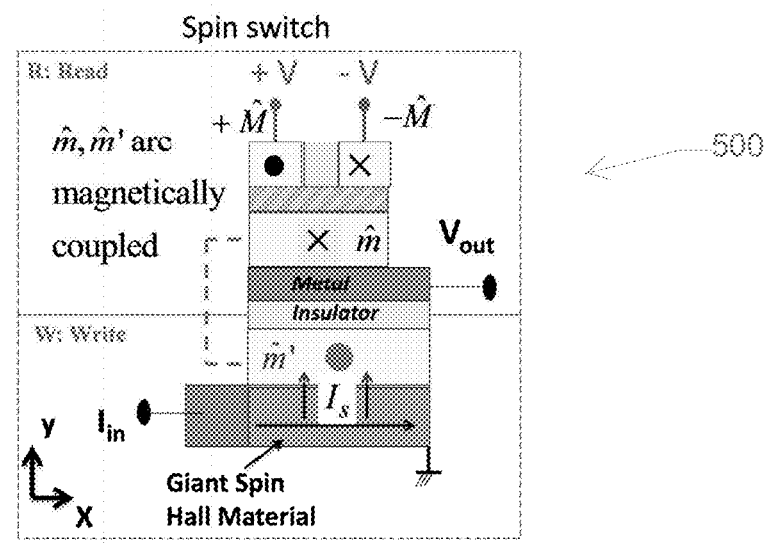
FIG. 15A
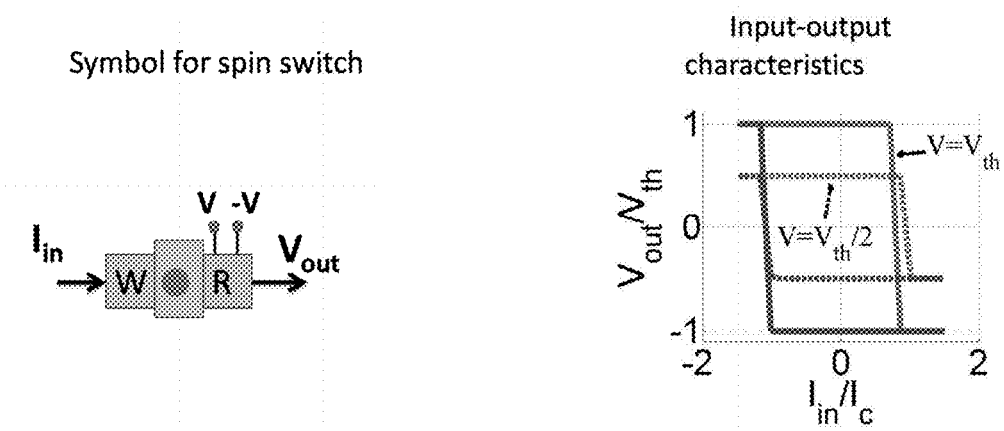
FIG. 15B
FIG. 15C

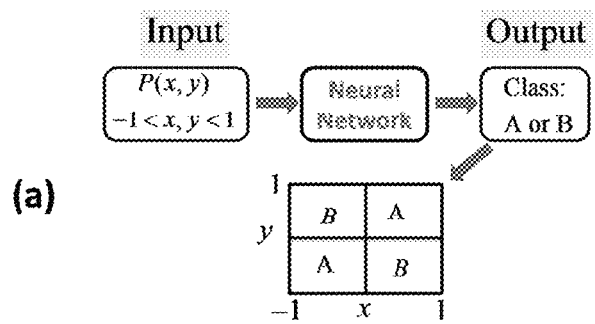
FIG. 19A
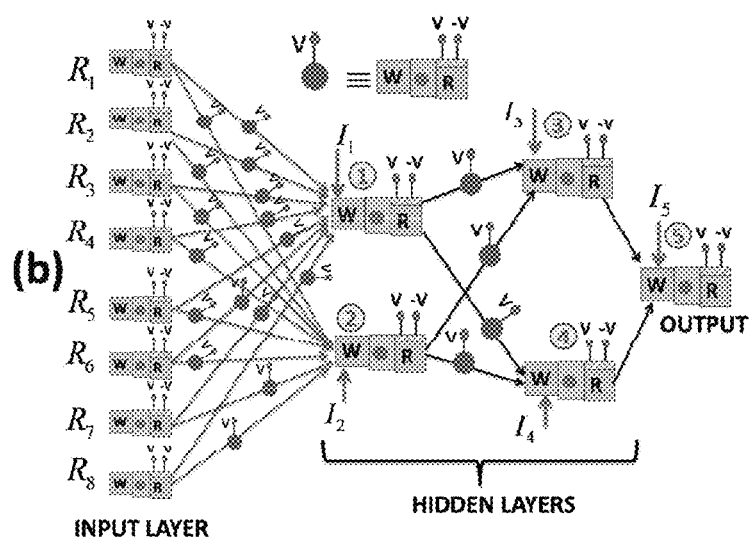
FIG. 19B
| Neuron | $R_1$-$R_8$ | 1 | 2 | 3 | 4 | 5 |
|---|---|---|---|---|---|---|
| $V/V_{th}$ | 2 | 2 | 2 | 2.2 | 2.2 | 0 |
| $I/I_c$ | 0 | 0.1 | 0.1 | -1.3 | -1.4 | -2 |
| Syn. | $V_{R1,1}$ | $V_{R2,1}$ | $V_{R3,1}$ | $V_{R4,1}$ | $V_{R5,1}$ | $V_{R6,1}$ | $V_{R7,1}$ | $V_{R8,1}$ |
|---|---|---|---|---|---|---|---|---|
| $V/V_{th}$ | 2.2 | 0 | 0.2 | -0.1 | -0.1 | 0.3 | 0 | 0.2 |
| Syn. | $V_{R1,2}$ | $V_{R2,2}$ | $V_{R3,2}$ | $V_{R4,2}$ | $V_{R5,2}$ | $V_{R6,2}$ | $V_{R7,2}$ | $V_{R8,2}$ |
|---|---|---|---|---|---|---|---|---|
| $V/V_{th}$ | 0.2 | -0.3 | 0 | -0.1 | 1.9 | 0 | 0 | 0 |
| Syn. | $V_{3,1}$ | $V_{4,1}$ | $V_{3,2}$ | $V_{4,2}$ |
|---|---|---|---|---|
| $V/V_{th}$ | -1.4 | 1.4 | 1.4 | -1.5 |
FIG. 19C

US 9,864,950 B2

COMPACT IMPLEMENTATION OF NEURON AND SYNAPSE WITH SPIN SWITCHES

RELATED APPLICATIONS

The present application claims the benefit of U.S. provisional application Ser. Nos. 61/933,290, filed Jan. 29, 2014 and 62/014,883, filed Jun. 20, 2014. The contents of both of these applications are hereby incorporated by reference in their entirety.

STATEMENT OF FEDERALLY SPONSORED RESEARCH OR DEVELOPMENT

This invention was made with government support under CCF0939370 awarded by the National Science Foundation. The government has certain rights in the invention.

TECHNICAL FIELD

The present invention relates generally to logic networks, including but not limited to neural networks, that have components that are based on spin transport and spin magnet interactions.

BACKGROUND

The term "neural network" often refers to models employed in statistics, cognitive psychology and artificial intelligence. Neural network models emulate, to some degree, the central nervous system. Neural networks can be characterized by principles of non-linear, distributed, parallel and local processing and adaptation. Neural networks can be implemented in software and digital logic. Modern software implementations of artificial neural networks are based on statistics and signal processing. In some of these systems, neural networks or parts of neural networks (like artificial neurons) form components in larger systems that combine both adaptive and non-adaptive elements.

A neural network can be described as a type of statistical model that consists of a set of inputs that can produce a set of outputs using sets of adaptive weights. The weights affect how the inputs are combined to produce logical outputs. A classic model of a neural network has a set of input nodes, a set of output nodes, and a set in intermediate or hidden nodes. Sets of inputs are connected to sets of intermediate nodes, and intermediate nodes are connected to sets of output nodes. Adaptive weights are used to determine how the value of each input node influences the output of the intermediate node. The combination of values from the intermediate nodes at each output influences that output. Many variants of this type of model have been implemented in circuitry and software.

Implementing neural networks in digital circuits can have space consumption issues due to the need for granularity of the weighting values and the binary nature of digital circuits. Since the advent of electronic circuits, the miniaturization of transistors and logic devices has been a universal goal to advance the capabilities and applicability of electronic devices. Neural networks implemented in circuitry are no exception.

There is a need therefore, for an implementation of neural networks that increasingly miniaturizes circuit implementation of at least some forms of neural networks.

SUMMARY

A circuit element includes first and second nanomagnets, at least first fixed magnet and a weighting circuit. The first nanomagnet is inductively coupled to a first current carrying element, and is configured to change polarity responsive to current in the first current carrying element. The second nanomagnet is magnetically coupled to the first nanomagnet and inductively coupled to a second current carrying element. The first fixed magnet is disposed on the second nanomagnet and has a first fixed polarity. The weighting circuit is operably coupled to provide a voltage to the first fixed magnet.

The above-described features and advantages, as well as others, will become more readily apparent to those of ordinary skill in the art by reference to the following detailed description and accompanying drawings.

BRIEF DESCRIPTION OF THE DRAWINGS

FIG. 5a shows an abbreviated schematic representation of the switch device of FIG. 4;

FIG. 5b shows a schematic diagram of the equivalent circuit of the switch device of FIG. 4;

FIG. 6a shows a schematic diagram of a first embodiment of a circuit that employs a plurality of circuit devices, each having the general design of the switch of FIG. 4.

FIG. 6b shows a resulting output signal pattern of device 601 of FIG. 4;

FIG. 6c shows a resulting output signal pattern of device 602 of FIG. 4;

FIG. 6d shows a resulting output signal pattern of device 603 of FIG. 4;

FIG. 15a shows a schematic diagram of a vertically oriented variant of the switching device of FIG. 4;

FIG. 15b shows a schematic symbol of the switch of FIG. 15a;

FIG. 15c shows the input output characteristics of the switch of FIG. 15a;

FIG. 16 shows a simplified single output circuit illustrating the propagation of information from one switching device of FIG. 15a to another switching device of FIG. 15a;

FIG. 18 shows a schematic diagram of a circuitry for providing weighting voltages for a neural device or network such as that shown in FIGS. 7, 17 and 19a;

FIG. 19a shows another exemplary embodiment of a neural network using devices having the structure of that shown in FIGS. 4 and/or 15a;

FIG. 19b shows a SS neural network (NN) implementation of the devices of FIG. 19a;

FIG. 19c depicts voltage weights applied to the device in FIG. 19a;

FIG. 20b illustrates the dynamics of the network of FIG. 20a

DETAILED DESCRIPTION

A key component to miniaturization is the reduction in operating voltage. One of the alternative approaches that that has recently received attention is nanomagnet logic (NML) using a nanomagnet to switch another nanomagnet using electron spin currents.

Figure 1:
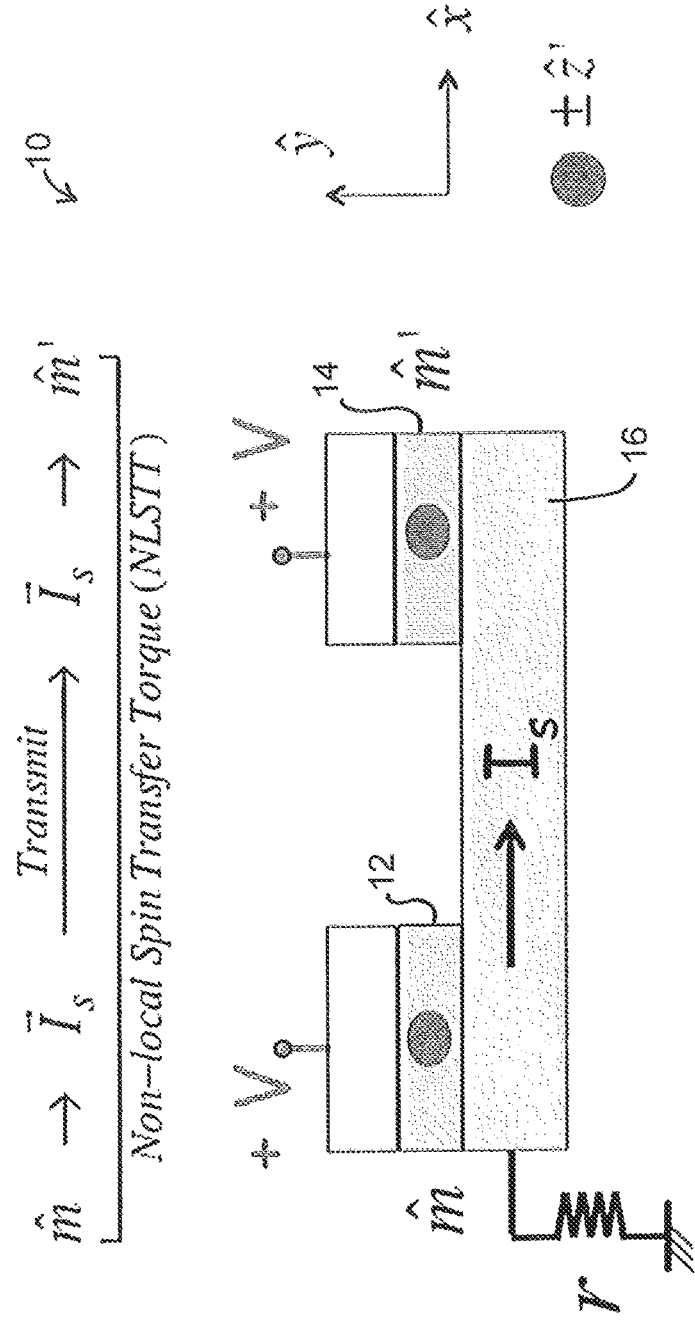
FIG. 1 shows a schematic block diagram of a prior art all-spin logic device.

U.S. patent application Ser. No. 13/345,588, filed Jan. 6, 2012, which is incorporated herein by reference in its entirety, teaches an all-spin logic nanomagnetic circuit in which a first nanomagnet imparts its current magnetic state to a second nanomagnet via spin currents that propagate through a spin coherent channel between the nanomagnets. Referring briefly to FIG. 1, a schematic block diagram of such an all-spin logic device 10 is shown. The device 10 includes a first nanomagnet 12, a second nanomagnet 14, and a spin-coherent channel 16. Each of the nanomagnets 12, 14 has one of two spin or magnetic "states". The circuit 10 is a simplified circuit in which the current state of the first nanomagnet 12 can be propagated onto the second nanomagnet 14 via application of a bias voltage to both nanomagnets.

In particular, upon application of the bias voltages, the bias voltage interacts with the current magnetic state of the first nanomagnet 12 to impart a spin current onto the spin coherent channel 16. The spin current has a magnetic polarity that corresponds to the magnetic state of the first nanomagnet 12. Thus, the spin current carries the information that is stored in the first nanomagnet 12. The spin current propagates to the second nanomagnet 14. The operation of the spin current and the bias voltage on the second nanomagnet 14 causes the second nanomagnet 14 to assume the "state" of the first nanomagnet 12.

A drawback to the circuit shown in FIG. 1 is that spin currents are not suitable for transmission through ordinary conductors, and require a specifically designed spin-coherent channel 16. Moreover, the spin currents have limited range within the spin-coherent channel 16, particularly at room temperature and elevated temperatures. The limitations on the propagation of spin currents renders the combinations of such devices impracticable.

Accordingly, there is a need for a practical implementation of a nanomagnet device that avoids at least some of the shortcomings of all-spin logic nanomagnetic devices and allows for versatility and scalable circuits. The above-described need, as well as others, are satisfied by at least some embodiments of a nanomagetic circuit that employs charged-coupled spin logic.

A first embodiment is a circuit element that includes first and second nanomagnets and first and second fixed magnets. The first nanomagnet is inductively coupled to a first current carrying element, and is configured to change polarity responsive to current in the first current carrying element. In one example, the first current carrying element includes a spin Hall effect substrate. The second nanomagnet is magnetically coupled to the first nanomagnet, and is inductively coupled to a second current carrying element. The first fixed magnet is disposed on the second nanomagnet and has a first fixed polarity, and second fixed magnet disposed on the second nanomagnet and has a second fixed polarity.

The first and second fixed magnets can be used, upon application of appropriate bias voltages, to cooperate with the second nanomagnet to produce a current flow having a direction that is indicative of the magnetic state or spin state of the second nanomagnet. The produced current thus carries "information" that is not reliant on spin currents alone, and can be readily employed in larger circuit combinations.

Figure 2:
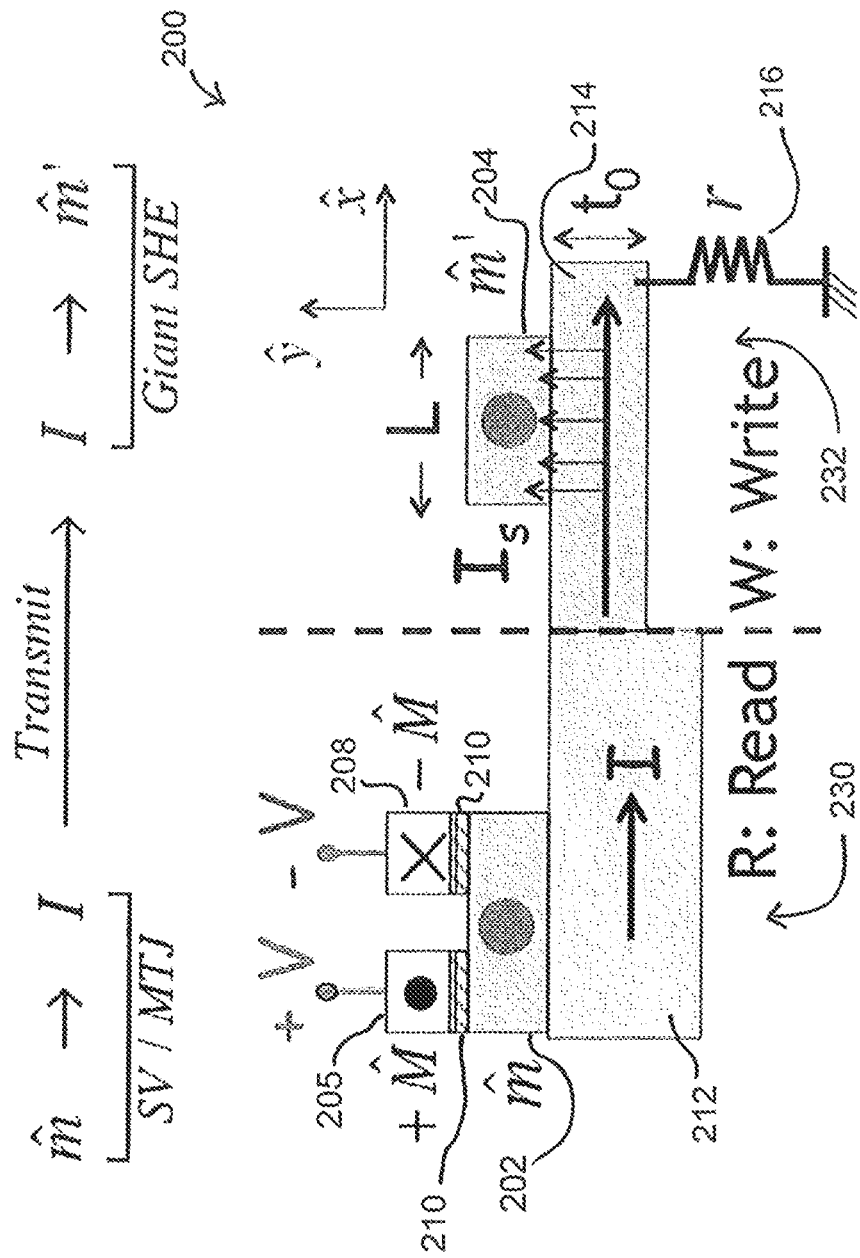
FIG. 2 shows a schematic diagram of a charged coupled nanomagnet device according to a first embodiment of the invention.

FIG. 2 shows a schematic diagram of a charged coupled nanomagnet device 200 that illustrates the underlying theory of operation of at least some embodiments of the invention. In general, the nanomagnet device 200 includes a first nanomagnet 202 having a first of two possible magnetic states, and a second nanomagnet 204 having one of two possible magnetic states. The operation of the device 200 illustrates how magnetic state information can be transferred from the first nanomagnet 202 to the second nanomagnet 204 using charge-coupled spin logic. The nanomagnets 202, 204 may suitably have the general construction of the nanomagnets of U.S. patent application Ser. No. 13/345,588. In this embodiment, the nanomagnets 202, 204 may suitably be CoFeB magnets having a thickness of on the order of 2 nanometers, although other materials and thicknesses may be used.

In general, the device 200 further includes a first fixed magnet 205, a second fixed magnet 208, at least one oxide layer 210, a conductor 212, a giant spin Hall effect ("GSHE") channel or substrate 214, and a terminal impedance 216. The first fixed magnet 205 is preferably formed as a nanopillar of permalloy, CoFeB or other magnetic material. The first fixed magnet 205 has a predetermined, and, for practical purposes, fixed polarity or magnetic state. For example, the first fixed magnet 205 may have a magnetization direction extending out from the paper as shown in FIG. 2. To this end, the material and/or thickness of the first fixed magnet 205 should be chosen such that its magnetic state is substantially less changeable than the nanomagnets 202, 204. For example, if formed of CoFeB, the first fixed magnet 205 should have a thickness several times that of the thickness of the nanomagnets 202, 204.

Similarly, the second fixed magnet 208 has a similar structure and also has a predetermined and fixed polarity or magnetic state which is anti-parallel of that of the first fixed magnet 205. In this example, the second fixed magnet 208 may have a magnetization direction extending into the paper as shown in FIG. 2. The first fixed magnet 205 is disposed above a first side of the first nanomagnet 202, and the second fixed magnet 208 is disposed above a second side of the first nanomagnet 204.

The first fixed magnet 205 and the second fixed magnet 208 are separated by from the first nanomagnet 202 by portions of the oxide layer 210. The oxide layer 210 should be configured to allow a spin valve or magnetic tunnel junction to develop between each of the fixed magnets 205, 208 and the first nanomagnet 202 the first nanomagnet 202 is in the corresponding state. The details generating spin valves and magnetic tunnel junctions are known.

The first nanomagnet 202 is disposed on the conductor 212. The conductor 212 may be any suitable conductor, including, but not limited to, a copper or other conductive substance. The conductor 212 is operably coupled to a first end of the GSHE channel 214. The termination impedance 216 is operably connected to the second (opposite) end of the GSHE channel 214. GSHE channel 214 is preferably a thin layer of tantalum, tungsten or platinum, although other materials may be used. The second nanomagnet 204 is disposed on the GSHE channel 214 at a location between the first end and the second end as shown.

In general, the device 200 actually includes two component devices: a read element 230 and a write element 232. The read element 230 includes the first nanomagnet 202, the fixed magnets 205, 208, the at least one oxide layer 210, and the conductor 212. As will be discussed below, the read element 230 is designed to "read out" the state of the nanomagnet 202 using the current I in the conductor 212. The write element 232 includes the GSHE channel or substrate 214, the second nanomagnet 204, and the terminal impedance 216. As will be discussed below, the write element is designed to "write" information, based on the current I, to the second nanomagnet 204. The device 200 thus operates to read out the information of the magnetic state of the first nanomagnet 202 and write that information to the second nanomagnet 204.

In the operation of the device 200, a positive bias voltage V+ is applied to the first fixed magnet 205, and a negative bias voltage V− is applied to the second fixed magnet 208. The orientation of the magnetic polarity of the nanomagnet 202 creates a spin valve or magnetic tunnel junction between the first nanomagnet 202 and one of the two fixed magnets 205, 208. Thus, if the first nanomagnet 202 has a first magnetic state (e.g. a first polarity), then a magnetic tunnel junction is created between the first fixed magnet 205 and the nanomagnet 202. If the first nanomagnet 202 has the second magnetic state (i.e. a second polarity), then a magnetic tunnel junction is created between the second fixed magnet 208 and the first nanomagnet 202. The magnetic tunnel junction creates a low impedance path through which the bias voltage V+ or V− may flow from the fixed magnets 205 or 208 to the terminal impedance 216.

The direction of the current I through the conductor 212 and the GSHE substrate 214 controls the magnetic state of the second nanomagnet 204. This control is a result of the spin Hall effect. In particular, if the current flows in a first direction (from V+ to ground), then the second nanomagnet 204 will change to (or stay in) the first magnetic state. If, however, the current flows in the second direction (from ground to V−), then the second nanomagnet 204 will change to (or stay in) the second magnetic state. To this end, the GSHE substrate 214 operates to create a spin Hall effect at or near the second nanomagnet 204. The spin Hall effect is one in which electrons of different polarity spin currents are separated into different directions. To this end, the GSHE substrate material causes the electrons with a first polarity spin to propagate a first spin current in a first direction away from the main current flow, and electrons with a second polarity spin to propagate a second spin current in a second direction away from the main current flow. As a result, current flowing from V+ to ground forces $e^+$ spin electrons in a first direction and $e^-$ spin electrons in a second direction. By contrast, current flowing from ground to V− forces $e^-$ spin electrons in the first direction and $e^+$ spin electrons in the second direction.

The clustering of the spin electrons in opposite sides imparts a magnetic state onto the nanomagnet 204. Thus, current flowing from V+ to ground causes the nanomagnet 204 to be in the first magnetic state, and current flowing from ground to V− causes the nanomagnet 204 to be in the second magnetic state. Accordingly, the overall operation is such that the state of the first nanomagnet 202 dictates the state of the second nanomagnet 204, provided the current I is of sufficient magnitude, which will be discussed further below.

One of the advantages of the device 200 is that the current flowing through the conductor 212 and GSHE substrate 214 can be of significant magnitude, thus allowing for separation of the nanomagnets 202, 204 using a conductor 212 of significant length. Because the "information" about the state of the first nanomagnet 202 is carried by the "direction" of the current, making the length of conductor 212 or amount of separation between the nanomagnets 202, 204 less significant. By contrast, the prior art all-spin logic device 100 relied on spin currents to carry information, which can only propagate information over short distances, and further requires a spin coherent channel 16 for the entire distance.

Figure 3:
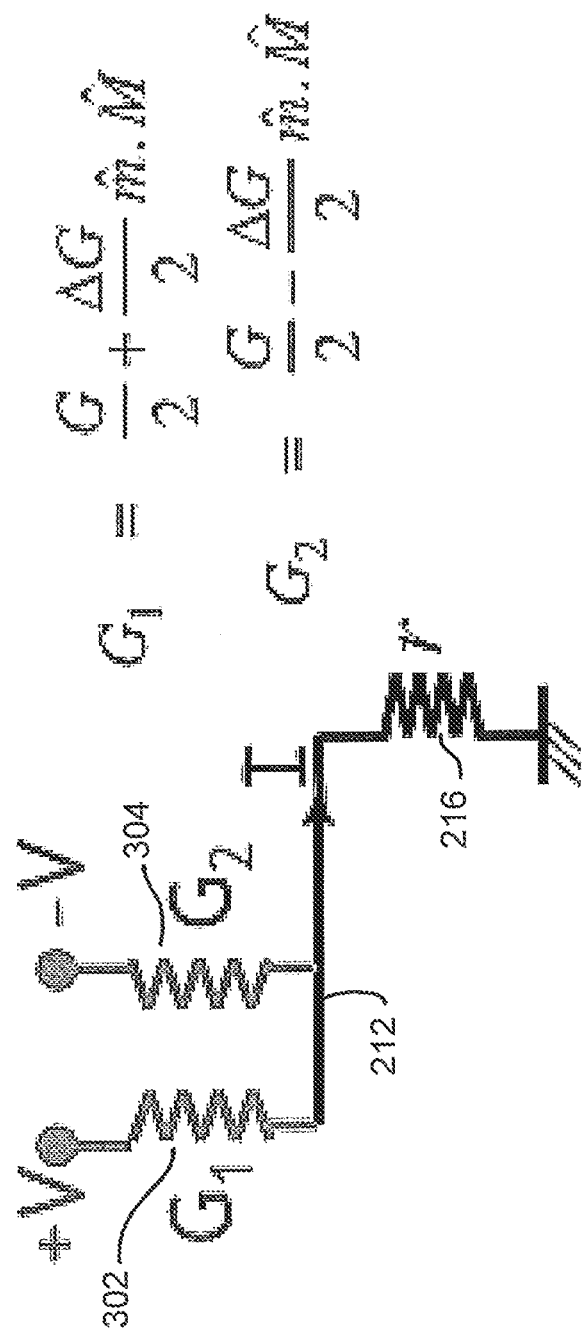
FIG. 3 shows an equivalent electrical schematic diagram of the device of FIG. 2.

FIG. 3 shows an equivalent electrical schematic diagram of the device 200 of FIG. 2. The conductance 302 represents the current path through the first fixed magnet 205, the oxide layer 210 and the first nanomagnet 202, while the conductance 304 represents the path through the second fixed magnet 208, the oxide layer 210 and the first nanomagnet 202. The conductance 302 has a conductance value of $G_1$, and the conductance 304 has a conductance value of $G_2$. The values of $G_1$ and $G_2$ depend on the magnetic state of the first nanomagnet 202, and hence, the magnetic tunnel junctions associated with each fixed magnet 205, 208. Referring to both FIGS. 2 and 3, it can be seen, therefore, that if the first nanomagnet 202 is in the first magnetic state, then the magnetic tunnel junction raises the value of $G_1$ and the low impedance path is formed between the V+ and ground. As a result, a current flows from V+ to ground. On the other hand, if the first nanomagnet 202 is in the second magnetic state, then the magnetic tunnel junction raises the value of $G_2$ and the low impedance path is formed between V− and ground. As a result, a current flows in the opposite direction, from ground to V−.

In further analytical detail, assume that G and $\Delta G$ represent the sum and difference, respectively, of the parallel ($G_P$) and anti-parallel ($G_{AP}$) conductances of the actual magnetic tunnel junctions through the oxide layer(s) 210. This circuit leads straightforwardly to the following expression for the current I:

$$I = \frac{V \Delta G}{1 + rG} \hat{m} \cdot \hat{M} \tag{1}$$

The current is thus proportional to the component of the input magnetization along a fixed direction $\hat{M}$ determined by the fixed magnets 205, 208. It should be noted that the magnitude of the current I for a given voltage V is determined by $\Delta G = G_P - G_{AP}$. It has been shown that a magnetic tunnel junction between a CoFeB fixed magnet (e.g. 205, 208) and a MgO nanomagnet (e.g. 202) has a resistance-area product of $A/G_P = 18$ ohm-$\mu m^2$. As a result, the $G_P = 0.45$ mS can be estimated, which with a tunnel magnetoresistance ("TMR") of 150% should provide $$\Delta G = G^P * TMR/(TMR+1) = 0.25 \text{ mS}$$

It should also be noted that the corresponding conductance G is ~(1.5 kilo-ohm)$^{-1}$ so that for a resistance r<<1 kilo-ohm, the denominator in Eq.(1) can be ignored.

Referring again to FIG. 2, the GHSE substrate 214 is preferably formed of high spin-orbit materials such as platinum or tantalum. A charge current I gives rise to a spin current $I_s$ that carries z spins in the y direction $$\vec{I}_s = \beta Iz \quad (2a)$$

where $$\beta = \text{Spin-Hall Angle} * (A_s/A) \quad (2b)$$

where $A_s$ and $A$ are the cross-sectional areas for the spin current and charge currents, respectively. For a magnet with length L=80 nm, this ratio could be ~50 if the thickness $t_0$ of the high spin-orbit metal layer (GSHE substrate 214) is 2 nm. Based on the demonstrated spin-Hall angle of 0.2 in tantalum, this would give a charge to spin amplification factor of $\beta$=8.

If $I_{s,c}$ represents the critical spin current required to switch the magnet, then the charge current I that is needed is given by I≥$I_{s,c}/\beta$. Thus, the voltages V+ and V− in FIG. 2 must be chosen such that I, when amplified by the spin amplification factor $\beta$, will be greater than the critical spin current ($I_{s,c}$). Given material parameters similar to those discussed in T. Kimura, Y. Otani, T. Sato, S. Takahashi, S. Maekawa, "Room-temperature reversible spin Hall effect," Phys. Rev. Lett. 98, 156601 (2007), which is incorporated herein by reference in its entirety, a critical spin current density can be estimated as:

$$J_{s,c} = (2q/\hbar)\alpha\mu_0 M_s t_0 (H_K + M_s/2) \sim 3 \times 10^6 \text{ A/cm}^2$$

where the damping parameter $\alpha$~0.01, saturation magnetization $\mu_0 M_s$~1 T, thickness $t_0$~1.6 nm and the coercive field $H_K << M_s$. This gives a critical spin current $I_{s,c}$~240 µA for a nanomagnet 204 of width W~100 nm in the direction perpendicular to the page in FIG. 2. With a $\beta$ of 8, thereby a charge current I of 30 µA would be needed.

Figure 4:
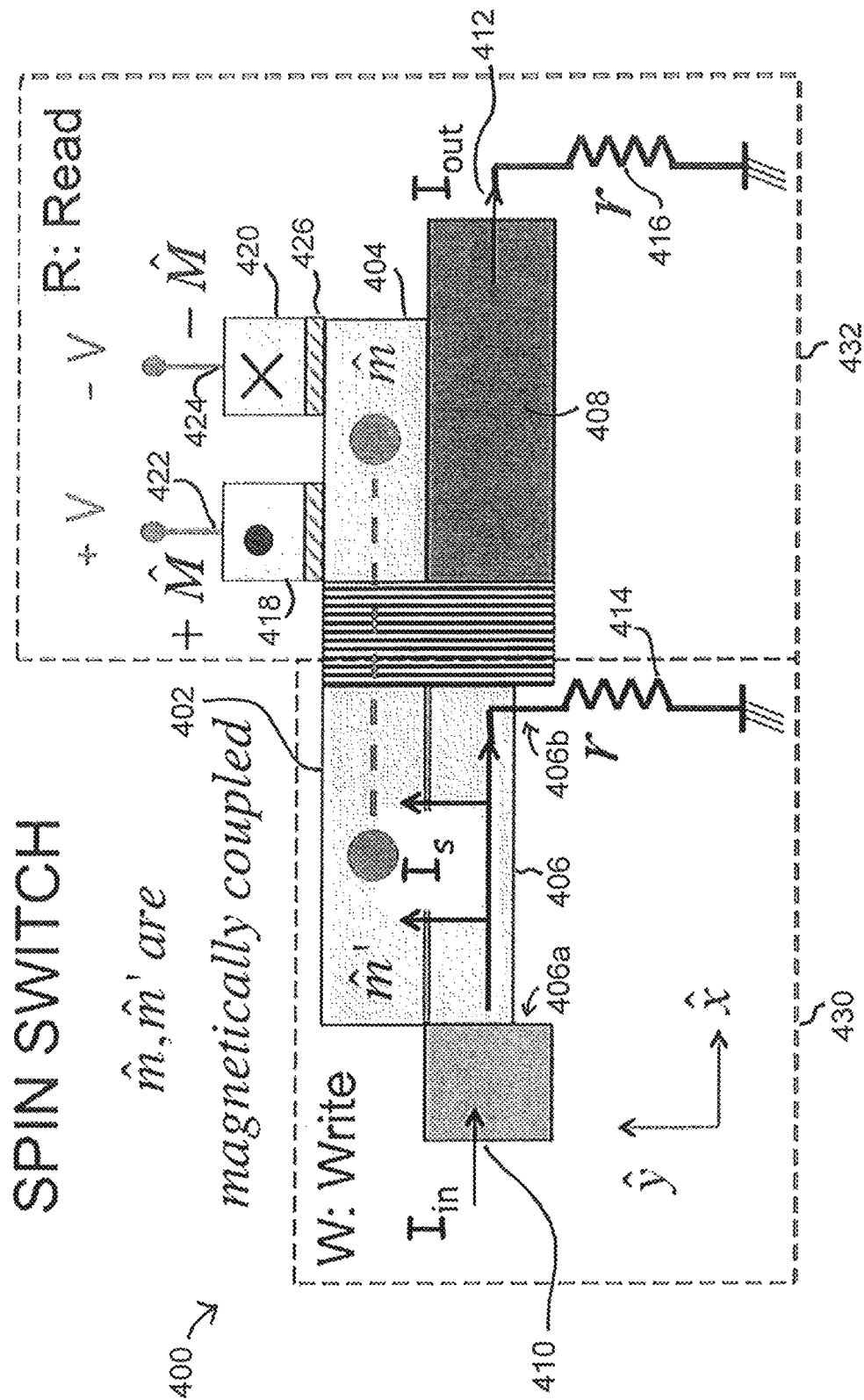
FIG. 4 shows a circuit element in the form of a magnetic spin switch according to a second embodiment of the invention.

The principles of the device 200 can be employed, along with other features, to create a concatenable spin device. FIG. 4 shows a circuit element in the form of a magnetic spin switch 400 that implements the principles of the device 200 of FIG. 2. In general, the switch 400 is a bistable device that includes a write unit 430 similar to the write element 232, and a read unit 432 similar to the write element 230. However, in contrast to the device 200 of FIG. 2, the write unit 430 is configured to control the state of the read unit 432.

In general, the switch 400 can be programmed to one of two magnetic states via the input current $I_{in}$ provided to the write unit 430. To read out the present magnetic state of the device, bias voltages V+ and V− are applied to the read unit 432, producing a current $I_{out}$ that carries the magnetic state information. As will be discussed below in connection with FIGS. 6a, 7, 9 and 10, the switch element 400 may be combined with various similar elements, and with various controlled sources of V+ and V− to create many logical circuits.

The circuit element 400 of FIG. 4 includes a first nanomagnet 402, a second nanomagnet 404, a first current carrying element 406, a second current carrying element 408, a current input 410, a current output 412, first and second biasing impedances 414, 416, a first fixed magnet 418, a second fixed magnet 420, a positive bias input 422, a negative bias input 424, and at least one oxide layer 426.

The first nanomagnet 402 and the second nanomagnet 404 may suitably have the same structure as the nanomagnets 202, 204 of FIG. 2 or the nanomagnets 12, 14 of FIG. 1. In this embodiment, however, the first nanomagnet 402 and the second nanomagnet 404 are magnetically coupled. By magnetically coupled, it is meant that a change in the magnetic state of the first nanomagnet 402 is induced magnetically on the second magnet 404. Thus, the magnetic angle θ between the nanomagnets 402, 404 always has a substantially fixed value. The interaction could be ferromagnetic, making θ=0, or antiferromagnetic, making θ=π. What is important is that θ be a fixed value independent of inputs and outputs. In this embodiment an antiferromagnet interaction that keeps the nanomagnets 402, 404 in anti-parallel is assumed. As will be discussed below, this causes the switch 400 to operate as a logical inverter.

As shown in FIG. 4, the first nanomagnet 402 is inductively coupled to the first current carrying element 406. The first nanomagnet 402 is configured to change polarity (i.e. magnetic state) responsive to current in the first current carrying element 406. To this end, the first current carrying element 406 in this embodiment is a GSHE substrate 406. The first nanomagnet 402 is disposed on a surface of the GSHE substrate 406 in the same manner that the second nanomagnet 204 is disposed on the surface of GSHE substrate 214 of FIG. 2. The current input 410 is operably and conductively coupled to a first end 406a of the GSHE substrate 406. The first impedance 414 is coupled proximate a second end 406b of the GSHE substrate 406, such that an input current $I_{in}$ flows between the first end 406a and the second end 406b of the GSHE substrate 406, and adjacent to the first nanomagnet 402.

As discussed above, the second nanomagnet 404 is magnetically coupled to the first nanomagnet 402. To this end, the second nanomagnet 404 may suitably be disposed immediately above the first nanomagnet 402, even though for purposes of clarity the second nanomagnet 404 is shown in FIG. 4 as being disposed beside the first nanomagnet 402. The second nanomagnet 404 is inductively coupled to the second current carrying element 408. The second current carrying element 408 may suitably be any conductive medium, such as one constructed of metal. The current output 412 is operably connected to the second current carrying element 408, and the second impedance 416 is coupled between the current output 412 and ground.

The first fixed magnet 418 is disposed proximate the second nanomagnet 404 and has a first fixed polarity. The first fixed magnet 418 is arranged on the second nanomagnet 404 in the same manner as the first fixed magnet 205 is arranged on the first nanomagnet 202 of FIG. 2. Thus, the at least one oxide layer 426 is disposed between the first fixed magnet 418 and the second nanomagnet 404. The second fixed magnet 420 is disposed on the second nanomagnet 404 in a similar manner and has a second fixed polarity. The at least one oxide layer 426 is disposed between the second fixed magnet 420 and the second nanomagnet 404. The first bias input 422 is operably coupled to the first fixed magnet 418 and the second bias input 424 is operably coupled to the second fixed magnet 420.

In operation, the switch 400 has two steady states. In a first state, the first nanomagnet 402 is in a first magnetic state, and the second nanomagnet 404 is in the opposite or second magnetic state (i.e. polarity). In the second state, the first nanomagnet 402 is in the second magnetic state and the second nanomagnet 404 is in the first magnetic state. In general, the current input 410 may be used to "write" information to the device 400, whereby the steady state of the circuit element 400 may be changed. The bias inputs 422, 424, on the other hand, may be used to read the current state of the circuit element 400 via the current output 412.

A first write operation involves applying a positive input current $I_{in}$ to the current input 410. Assuming the applied current $I_{in}$ has sufficient magnitude (discussed further below), the positive input current causes the switch 400 to be in the first state. A second write operation involves applying a negative input current $I_{in}$ to the current input 410. Assuming the current magnitude is sufficient, the negative input current causes the switch 400 to be in the second state. It will be appreciated that the circuit element 400 has hysteresis, and a certain of positive or negative current is required to change the current state.

Assuming a positive current $I_{in}$ is provided to the current input 410, the current $I_{in}$ propagates through the GSHE substrate 406 to the first impedance 414. Because the current input 410 and the first impedance 414 are proximate opposing ends 406a, 406b, respectively of the GSHE substrate 406, the current $I_{in}$ flows past the surface of the first nanomagnet 402. The GSHE substrate 406 generates the spin Hall effect to split off up spin electrons $e^+$ and the down spin electrons $e^-$ in a manner that induces the first nanomagnet 402 to be in the first magnetic state, similar to the operation of the GSHE substrate 214 of FIG. 2. It will be appreciated that if the first nanomagnet 402 is already in the first magnetic state, then the current $I_{in}$ has no effect. If, however, the first nanomagnet 402 was previously in the second magnetic state, then the current $I_{in}$ operates as described above to change the first nanomagnet 402 to the first magnetic state. The first nanomagnet 402 furthermore induces magnetic force on the second nanomagnet 404 via the magnetic coupling, thereby causing the second nanomagnet 404 to change state to the second magnetic state. It will be appreciated that the current $I_{in}$ must satisfy the condition $I_{in} \geq I_{s,c}/\beta$ to cause the first nanomagnet 402 to change state. This feature of requiring currents of sufficient magnitude can be used to generate complex combinations of circuit devices 400 that employ various levels of current in combination to force a change in state, as will be discussed further below in connection with FIGS. 7, 9 and 10.

Accordingly, assuming a positive current $I_{in}$ (i.e. flowing from the input 410 to the impedance 414) of sufficient magnitude is received at the current input 410, then the circuit device 400 can change from the second state to the first state. Otherwise, a positive current $I_{in}$ has no effect.

Similarly, if a negative current $I_{in}$ of sufficient magnitude ($I_{in} \geq I_{s,c}/\beta$) is received at the current input 410 (i.e. flowing from the impedance 414 to the current input 410), then the circuit device 400 can change from the first state to the second state. In particular, the negative current $I_{in}$ propagates through the GSHE substrate 406 from the first impedance 414 to the current input 410, past the surface of the first nanomagnet 402. The GSHE substrate 406 employs the spin Hall effect to split off up spin electrons $e^+$ and the down spin electrons $e^-$ in a manner that induces the first nanomagnet 402 to be in the second magnetic state, similar to the operation of the GSHE substrate 214 of FIG. 2. The first nanomagnet 402 furthermore induces magnetic force on the second nanomagnet 404 via the magnetic coupling, thereby causing the second nanomagnet 404 to be in the first magnetic state. As with the positive current discussed above, if the negative current $I_{in}$ is insufficient to cause the first nanomagnet 402 to overcome the resisting force of the second nanomagnet 404, then the states of the first nanomagnet 402 and the second nanomagnet 404 do not change.

While the above operations illustrate how information is written to the switch 400 using the write unit 430, it is the application of bias voltages to the bias inputs 422, 424 to the read unit 432 that reads out the written information. To read out information, a positive bias voltage V+ is applied to the first bias input 422, and a negative bias voltage V− is applied to the second bias input 424. As discussed above in connection with the operation of the fixed magnets 205, 208 and nanomagnet 202 of FIG. 2, the present magnetic state of the second nanomagnet 404 creates a magnetic tunnel junction between either the first fixed magnet 418 and the nanomagnet 404, or the second fixed magnet 420 and the nanomagnet 404. As a consequence, if the second nanomagnet 404 is in the first magnetic state, then the conductance from the first bias input 422 (with the positive bias voltage) and the output 412 is increased, and positive current $I_{out}$ flows from the first bias input 422 to the current output 412. Contrariwise, if the second nanomagnet 404 is in the second magnetic state, then the conductance from the second bias input 424 (with the negative bias voltage) and the output 412 is increased, and negative current $I_{out}$ flows from the first bias input 424 to the current output 412.

As a consequence, by providing suitable positive and negative voltages on the inputs 422, 424, the state of the circuit device 400 can be determined by the sign of the current at the current output 412. It will be appreciated that the magnitude of the output current (for either direction) can be adjusted by adjusting the magnitude of the bias voltages V+ and/or V−. As will be discussed below, adjustment of these voltages may be used to create combinatorial gates of the multiple units of the circuit device 400.

FIG. 5a shows an abbreviated schematic representation of the switch device 400 of FIG. 4. The device 400 includes the current input 410, the current output 412, the first bias input 422, the second bias input 424, the write unit 430, and the read cell 432. The representation of FIG. 5a is useful for showing circuits containing multiple of such devices.

FIG. 5b illustrates an equivalent circuit of the switch device 400, wherein the values $I_{in}, I_{out}$ are the same as the corresponding values of FIG. 4. The input circuit 436 and input current $I_{in}$ through Eq.(2), discussed above in connection with FIG. 3 determines the spin current $\beta I_{in}$ entering the nanomagnet 402 (represented in FIG. 5b as $\hat{m}'$) whose easy axis $\hat{Z}$ is assumed to make a small angle (~0.1 radian) with the direction $\hat{Z}$ of the spins so as to speed up the switching process. The output circuit 437 describes the output current $I_{out}$ which is determined by the output nanomagnet 404 (represented in FIG. 5b as $\hat{m}$) and the associated fixed magnets 418, 420 (represented in FIG. 5b as $\pm\hat{M}$) through Eq. (1).

Given that the nanomagnet 404 (like the nanomagnet 402) has its easy axis along $\hat{Z}$, and the two fixed magnets 418 and 420 point along $+\hat{Z}$ and $-\hat{Z}$ respectively, so that $I_{out}$ is governed by $$I_{out} = +\frac{V\Delta G}{1+rG} \text{ or } -\frac{V\Delta G}{1+rG} \qquad (3)$$

depending on whether the nanaomagnet 404 points along (or aligns with) the first fixed magnet 418 or the second fixed magnet 420.

Figure 5C:
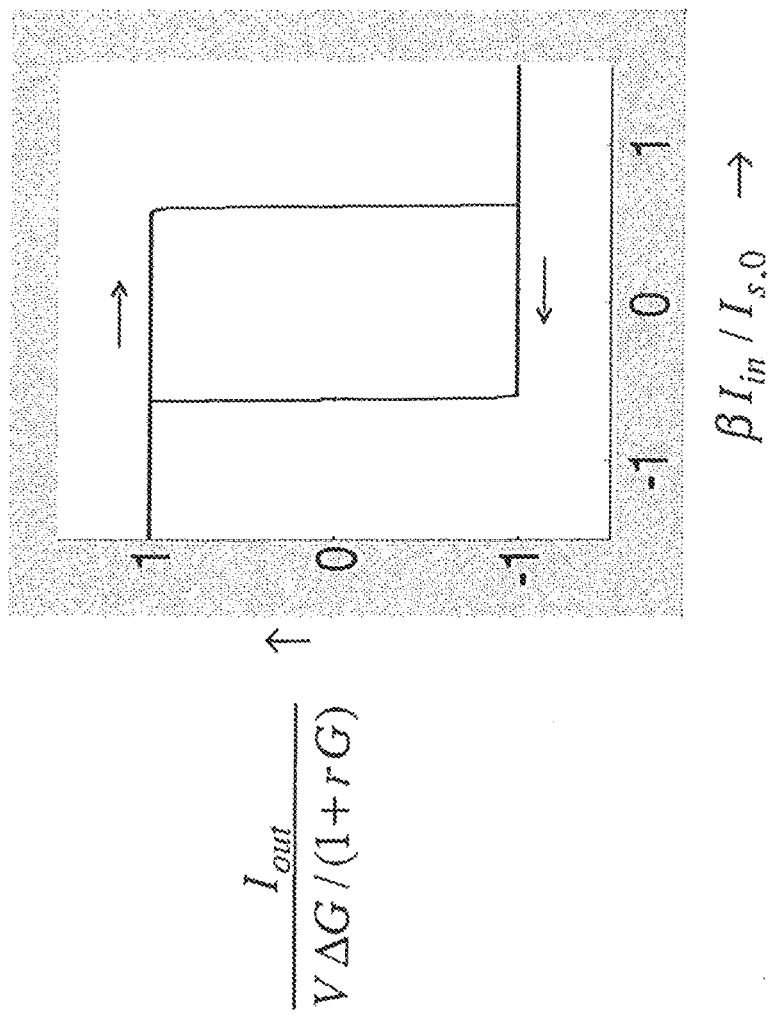
FIG. 5c shows the input/output characteristic for the switch of FIG. 4.

To see why the spin switch should give rise to the input-output characteristics in FIG. 5b, it should be noted that if the current $I_{in}$ entering the write unit 430 is large enough to generate a spin current $\beta I_{in}$ through the GSHE substrate 406 that exceeds the critical value of $I_{s,c}$, it will switch the nanomagnet 402 to the $+\hat{Z}$ direction, putting the other nanomagnet 404 of the pair in the $-\hat{Z}$ direction, so that the output current $I_{out}=-V\Delta G/(1+rG)$ (see Eq.(3)). If the input current $I_{in}$, however, is reversed beyond the critical value, then the nanomagnets 402, 404 are switched in the opposite direction with a reversal of the output current, resulting in a hysteric inverter-like characteristic as shown in FIG. 5c. FIG. 5c shows the input/output characteristic for the switch 400 of FIG. 4. Note that the sign of $I_{out}/I_{in}$ in FIG. 5c could be changed by reversing either the sign of the β or the V associated with the write unit 430 and the read unit 432, respectively. Thus, as discussed above, it is possible to create a non-inverting device 400 by merely changing the voltages applied to the bias inputs 422, 424.

A more detailed quantitative analysis can be carried out using a pair of Landau-Lifshitz-Gilbert ("LLG") equations to model the pair of nanomagnets 402, 404 as two macrospins $\hat{m}'$ and $\hat{m}$, respectively, coupled by the dipolar interaction.

$$(1+\alpha'^2)\frac{d\hat{m}'}{dt} = -|\gamma|\mu_0 \hat{m}' \times \vec{H}' - \quad (4a)$$

$$\alpha'|\gamma|\mu_0 \hat{m}' \times \hat{m}' \times \vec{H}' - \hat{m}' \times \hat{m}' \times \frac{\vec{i}_{s'}}{qN_{s'}} + \alpha'\hat{m}' \times \frac{\vec{i}_{s'}}{qN_{s'}}$$

$$(1+\alpha'^2)\frac{d\hat{m}}{dt} = \quad (4b)$$

$$-|\gamma|\mu_0 \hat{m} \times \vec{H} - \alpha|\gamma|\mu_0 \hat{m} \times \hat{m} \times \vec{H} - \hat{m} \times \hat{m} \times \frac{\vec{i}_s}{qN_s} + \alpha \hat{m} \times \frac{\vec{i}_s}{qN_s}$$

Here γ is the gyromagnetic ratio, α, α', the damping parameter and $N_s=M_sV/\mu_B$, $N_s'=(M_sV)'/\mu_B$ are the number of spins comprising each magnet ($\mu_B$: Bohr magneton). Also, $$=\vec{H}=H_k m_z\hat{z}-H_d m_y\hat{y}-H_f\hat{m}' \quad (5a)$$

$$\vec{H}'=H'_k m'_z\hat{z}-H'_d m'_y\hat{y}-H_f\hat{m} \quad (5b)$$

represent the easy axis fields (Hk, H'k), the demagnetizing fields ($H_d$, $H'_d$) plus the dipolar fields.

An exact treatment of the dipolar fields would require a detailed consideration of the shape of each magnet, but the approximate expression in Eqs. 5(a) and 5(b) should be adequate with $H_f=(M_sA_s)'/d^2$, $H_b=(M_sA_s)/d^2$, $M_s$, $M_s'$ being the saturation magnetizations, $A_s$, $A_s'$, the areas (in x-z plane) and d, the distance (along x) between the magnets.

Since it is desired for the Write (first) nanomagnet 402 ($\hat{m}'$) to switch the Read (second) nanomagnet 404 ($\hat{m}$), it helps speed up the process if the forward interaction $H_f$ is designed to be larger than the backward one $H_b$. The simplest way to achieve this is to make the write magnet 402 larger than the read magnet 404, but more sophisticated approaches based on engineering material parameters may be possible too.

The input-output characteristics shown in FIG. 5c were obtained numerically by solving Eqs.(4a) and (4b) assuming the following parameters:

α=0.01, $H'_k=H_k$, $H'_d=H_d=50\ H_k$,
$H_f=1.1H_k$, $H_b=0.9H_k$
The normalizing factor $I_{s,0}$ is defined as $$I_{s,0}=qN_s|\gamma|\mu_0 H_k=(2q/\hbar)\mu_0 H_k M_s V$$

With $H_k$=200 Oe, $M_s$=$10^6$ A/m and magnet dimensions 100 nm×80 nm×1.6 nm, (FIG. 3d), $$I_{s,c}\approx 0.6 I_{s,0}\approx 460\ \mu A$$

Smaller critical currents are obtained if a forward to backward dipolar interaction ratio larger than the present one (11:9) is assumed.

Combinations of switches having the structure of the switch 400 necessarily involve connecting the read unit 432 of first switch 400 with a write unit, not shown, of a further switch, not shown. Assuming the write unit of the further switch has a β of 8 as estimated earlier following Eq.(2), this would require an input current of ~60 μA from the read circuit 432 of the first switch 430. With a ΔG of 0.25 mS as estimated earlier for 100 nm×80 nm cross-section, this would need a V~250 mV. Note that the read currents are approximately (⅛) of the write current and the simulations based on Eqs.(4) show that they do not interfere significantly with the writing process, except to slow it or speed it up a little. Indeed larger read currents should be possible allowing a fan-out of 2 to 4. This is a key feature arising from the charge to spin gain associated with the SHE.

FIG. 5c shows the I/O characteristic of the circuit device 400, normalized. It will be appreciated that in this case, the circuit device 400 is configured as an inverter, wherein the first nanomagnet 402 has the opposite magnetic state from the second nanomagnet 404. Thus, when a positive current is received at the current input 410, the first nanomagnet 402 changes to the first magnetic state and the second nanomagnet 404 changes to the second magnetic state. When the circuit device 400 is read out, the output current would be negative. It will be appreciated that the circuit device 400 can readily be configured as either an inverting or a non-inverting device as desired. For example, the inverting/non-inverting configuration can be carried out via the physical placement of the bias inputs 422, 424, or even by selective application of the positive and negative bias voltages on the bias inputs 422, 424. For example, it will be appreciated that if applying a positive bias voltage on the bias input 422 and a negative bias voltage on the bias input 424 produces a non-inverting device then applying a negative bias voltage on the bias input 422 and a positive bias voltage on the bias input 424 will produce an inverting device.

FIG. 6a shows a schematic diagram of a first embodiment of a circuit 600 that employs a plurality of circuit devices 601, 602, 603, each of the circuit devices 601, 602, 603 having the general design of the switch 400. In this embodiment, the devices 601, 602, 603 are configured as inverting devices. The circuit 600 of FIG. 6a is configured as a ring oscillator. In particular, the current output of read unit 601b of the first device 601 is coupled to the current input of the write unit 602a of the second device 602, the current output of the read unit 602b of the second device 602 is coupled to the current input of the write unit 603a of the third device 603, and the current output of the read unit 603b of the third device 603 is coupled to the current input of the write unit 601a of the first device 601. In this configuration, a control circuit, not shown in FIG. 1, provides constant positive and negative voltage to the respective bias inputs (not shown, but which are similar to bias inputs 422, 424) of the read units 601b, 602b, 603b.

In an exemplary operation, the first device 601 provides a positive current from its read unit 601b to the second device 602. In response to receiving the positive current, the second device 602 generates a negative current at its read unit 602b. The second device 602 thereby provides the negative current to the write unit 603a of the third device 603. The third device 603 receives the negative current and generates a positive current at its read unit 603b responsive thereto. The third device 603 provides the positive current to the write unit 601a of the first device 601 via the read unit 603b. The first device 601 receives the positive current and generates a negative current therefrom. The first device 601 provides the negative current from its read unit 601b to the second device 602. Thus, due to the inverter operation provided by each of the devices 601, 602, 603, the current at the current output of the read unit 601b changes from a positive output, discussed further above, to a negative output. A corresponding change occurs in the output current at each of the devices 602, 603. Because there are an odd number of inverting devices 601, 602, 603, no steady state is reached and an oscillator is formed. FIGS. 6b, 6c and 6d show the resulting output signal patterns of the devices 601, 602 and 603, respectively.

As discussed further above, it is also possible to manipulate the bias voltages to create more complex analog/digital logical structures. For example, it is possible to interconnect the spin switches having the design of the circuit device 400 to implement hardware neural networks like the non-limiting example shown in FIG. 7. In particular, FIG. 7 shows a schematic diagram of a neural network circuit 700 that includes a plurality of devices $702_{1,1}$, $702_{1,2}$, $702_{2,1}$, etc., each having the general design of the switch 400 of FIG. 4.

Figure 7:
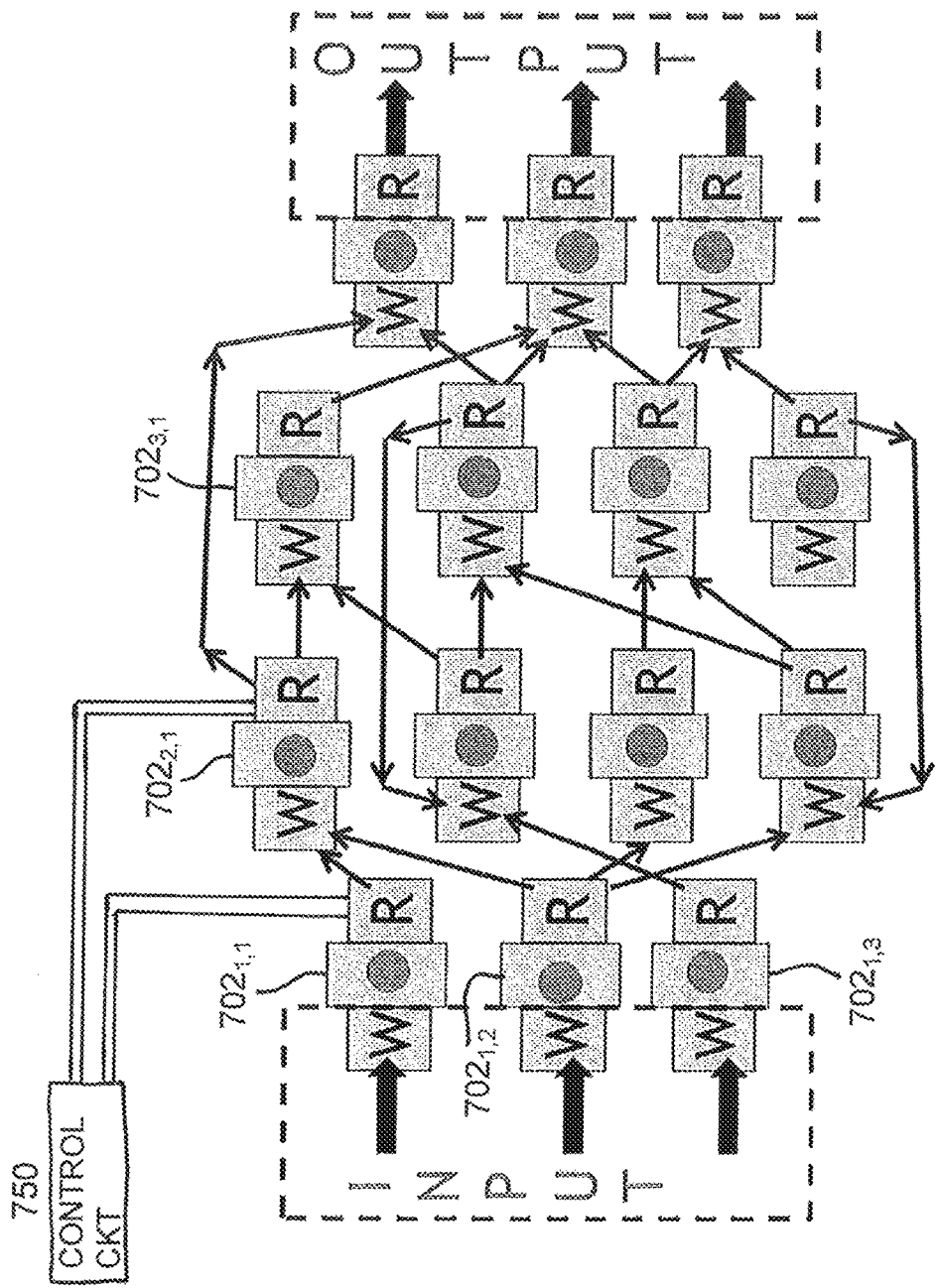
FIG. 7 shows a schematic diagram of a second embodiment of a circuit that includes a plurality of devices, each having the general design of the switch of FIG. 4.

In FIG. 7, the plurality of devices $702_{1,1}$, $702_{1,2}$, $702_{2,1}$ etc. have their bias inputs (e.g. inputs 422, 424 of FIG. 4) connected to a control circuit 750. Each device $702_{x,y}$ constitutes a node x, y of the neural network circuit 700. The connections between nodes x, y are the connections between the read unit (e.g. 432 of FIG. 4) of one node $x_i$, $y_i$ to the write unit (e.g. 430 of FIG. 4) of the connected downstream node $x_j$, $y_j$. Such connections are modeled by the device 200 of FIGS. 2 and 3, which show a read unit 230 coupled to a write unit 232. Each node has a predetermined weight $a_{x,y}$ determined by the control circuit 750. In particular, the control circuit 750 preferably provides a predetermined set of bias voltages $V_{x,y}$ to each device $702_{x,y}$ that corresponds to the node weight $a_{x,y}$. Both the sign and the magnitude of the weights $a_{x,y}$ associated with each device $702_{x,y}$ can be conveniently adjusted by the control circuit 750 through the voltages $V_{x,y}$.

In general, the plurality of devices $702_{1,1}$, $702_{1,2}$, $702_{2,1}$, etc. can be interconnected in a combinatorial manner to carry out any neural network design having a set of interconnected nodes and a set of weights associated with each of the nodes. The devices $702_{1,1}$, $702_{1,2}$, $702_{2,1}$, etc. represent the nodes, and the weights are implemented via the corresponding voltages $V_{1,1}$, $V_{1,2}$, $V_{2,1}$, etc. provided to the bias inputs (e.g. inputs 422, 424) of each device $702_{i,j}$ by the control circuit. Adjusting the size or area of the first (write) nanomagnet (e.g. nanomagnet 402) may also be used to adjust the weighting factors. For example, by making the first (write) nanomagnet smaller in a node x, y, it will require a greater sum of currents from the various devices that feed the node x, y.

Using present day technology it should be possible to implement weights large enough to exceed switching thresholds, but even subthreshold networks could find use in probabilistic logic as discussed for ASL in B. Behin-Aein, A. Sarkar and S. Datta, "Modeling spins and circuits for all-spin logic", Proc. ESSDERC (2012), which is incorporated herein by reference in its entirety.

It should be noted that ordinarily it may be advisable to use resistances $r_j$ (e.g. 414, 416 of FIG. 4) that are much lower than the output conductance $G_{tot}$ set by the magnetic tunnel junction in all devices that feed into a device $702_{x,y}$, so that this factor is negligible. On the other hand the impedance r could be a phase change resistance that could provide an automatic adjustment of weights, making it possible for a network to "learn."

Figure 8:
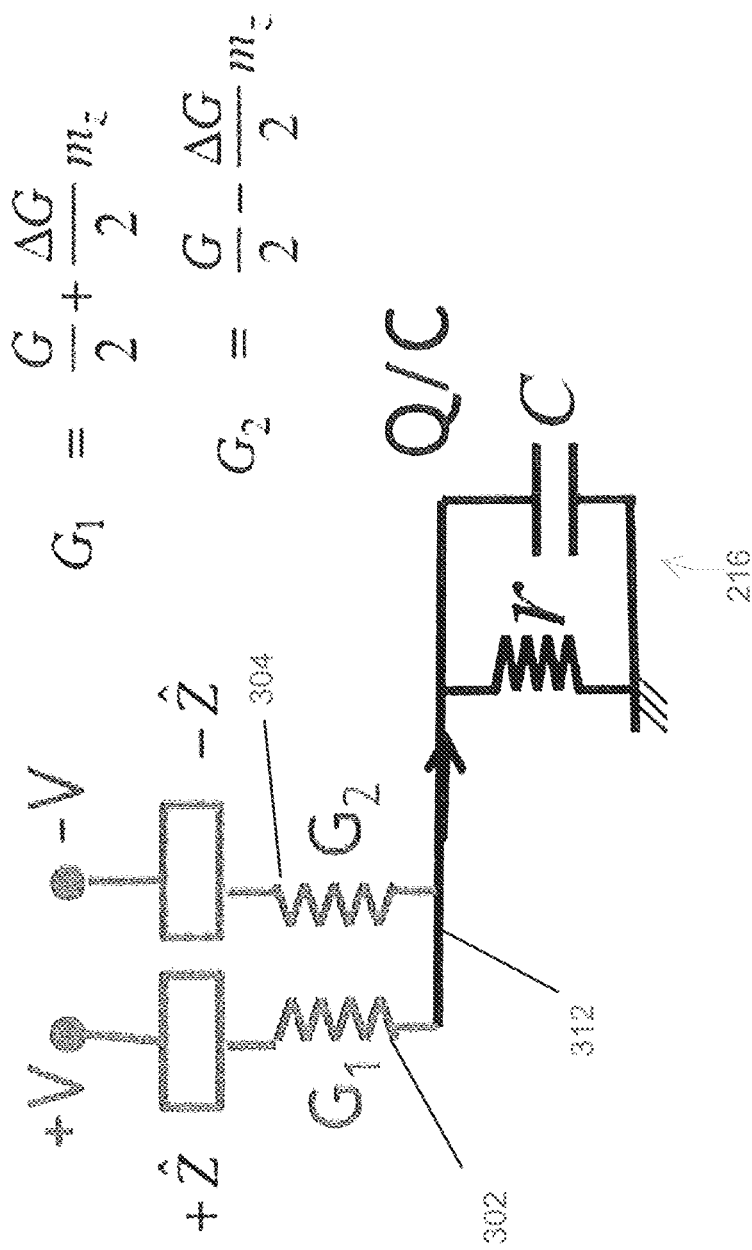
FIG. 8 is a schematic diagram of an equivalent circuit for an alternative embodiment of the circuit of FIGS. 2 and 3.

Referring again to FIG. 3, one drawback of the structure in FIG. 2, which models the read unit to write unit signal propagation of FIG. 7 as discussed above, can be the standby current which could be avoided by replacing the resistor "r" with a capacitor. Below, a simulated operation of a majority gate with fan-out including capacitors in parallel with the "r". FIG. 8 is a schematic of an equivalent circuit for a single read unit driving a single write unit (same as FIG. 3, but redrawn to include the capacitor C as part of the impedance 216). Other possible approaches include the use of a voltage driven writing mechanism instead of a current-driven one.

Figure 9:
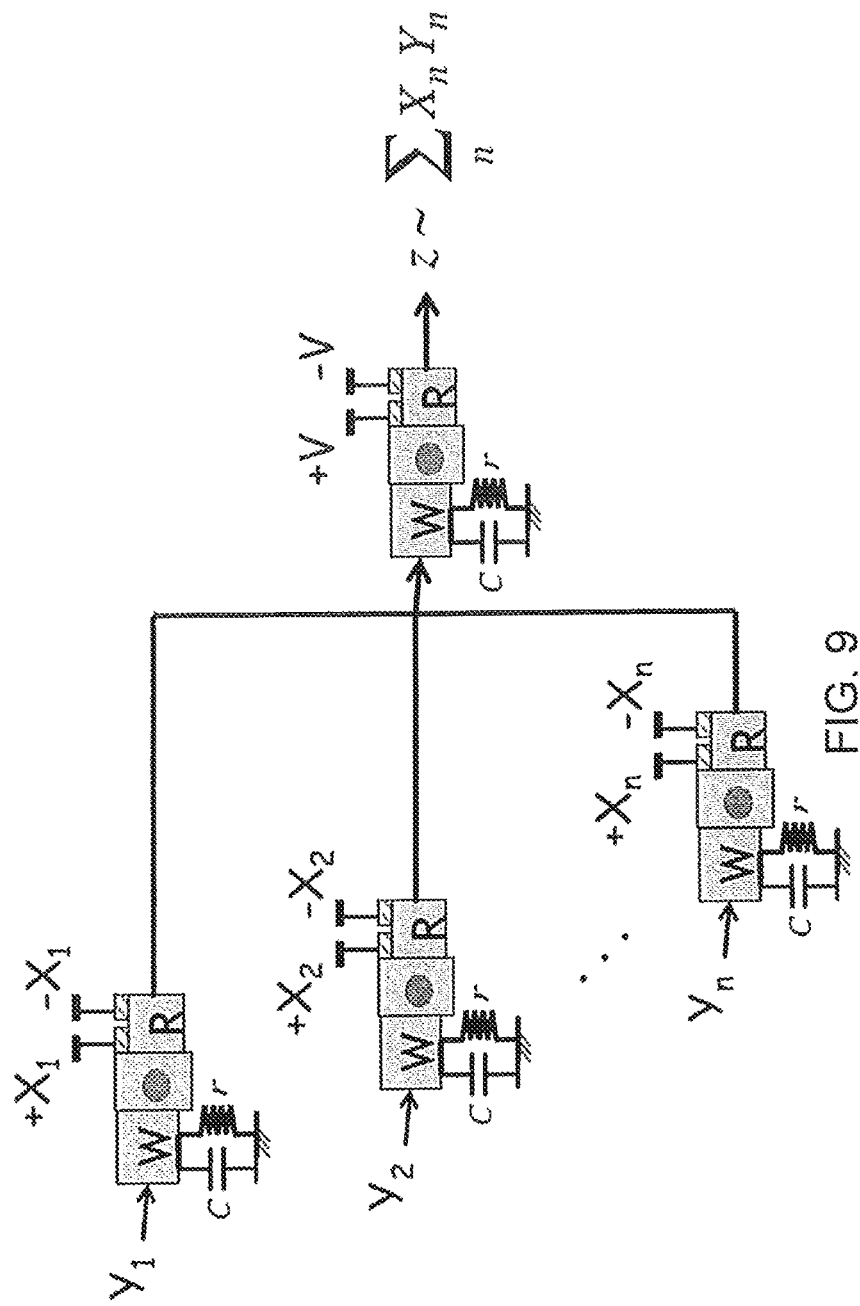
FIG. 9 shows a schematic diagram of a third embodiment of a circuit that includes a plurality of devices, each having a modification of the general design of the switch of FIG. 4.

One advantage of the devices of FIGS. 2 and 4 is that a voltage supply (e.g. from the control circuit 750) is not needed for digitization. The digitization comes from the nanomagnets (e.g. 402, 404). Thus, the bias voltages can be adjusted in an analog manner to provide both positive and negative interconnection weights for neural networks. For example, FIG. 9 shows a device that could be implemented by interconnecting the spin switches having the design of the switch of FIG. 4 according to the present disclosure which provides an output that correlates the incoming signal $\{X_n\}$ with a reference signal $\{Y_n\}$ stored in the $m_z$ of the switches that could be any string of +1's and −1's of length N, N being a large number.

Since the output current (see Eq. (1)) of each Read unit is a product of V ($\sim X_n$) and $m_z$ ($\sim Y_n$), it is determined by $X_n Y_n$ which are all added up to drive the output magnet. If $\{X\}$ is an exact match to $\{Y\}$, then the output voltage will be N, since every $X_n * Y_n$ will equal +1, being either +1*+1 or −1*−1. If $\{X\}$ matches $\{Y\}$ in (N−n) instances with n mismatches, the output will be N−(2*n) since every mismatch lowers output by 2. If the threshold for the output magnet is set to N−(2*Ne) then the output will respond for all $\{X\}$ that matches the reference $\{Y\}$ within a tolerance of Ne errors.

Other novel applications are possible based on the fact that since magnets provide the digitization, the voltages can be used for "weighting" instead of "gating."

Figure 10:
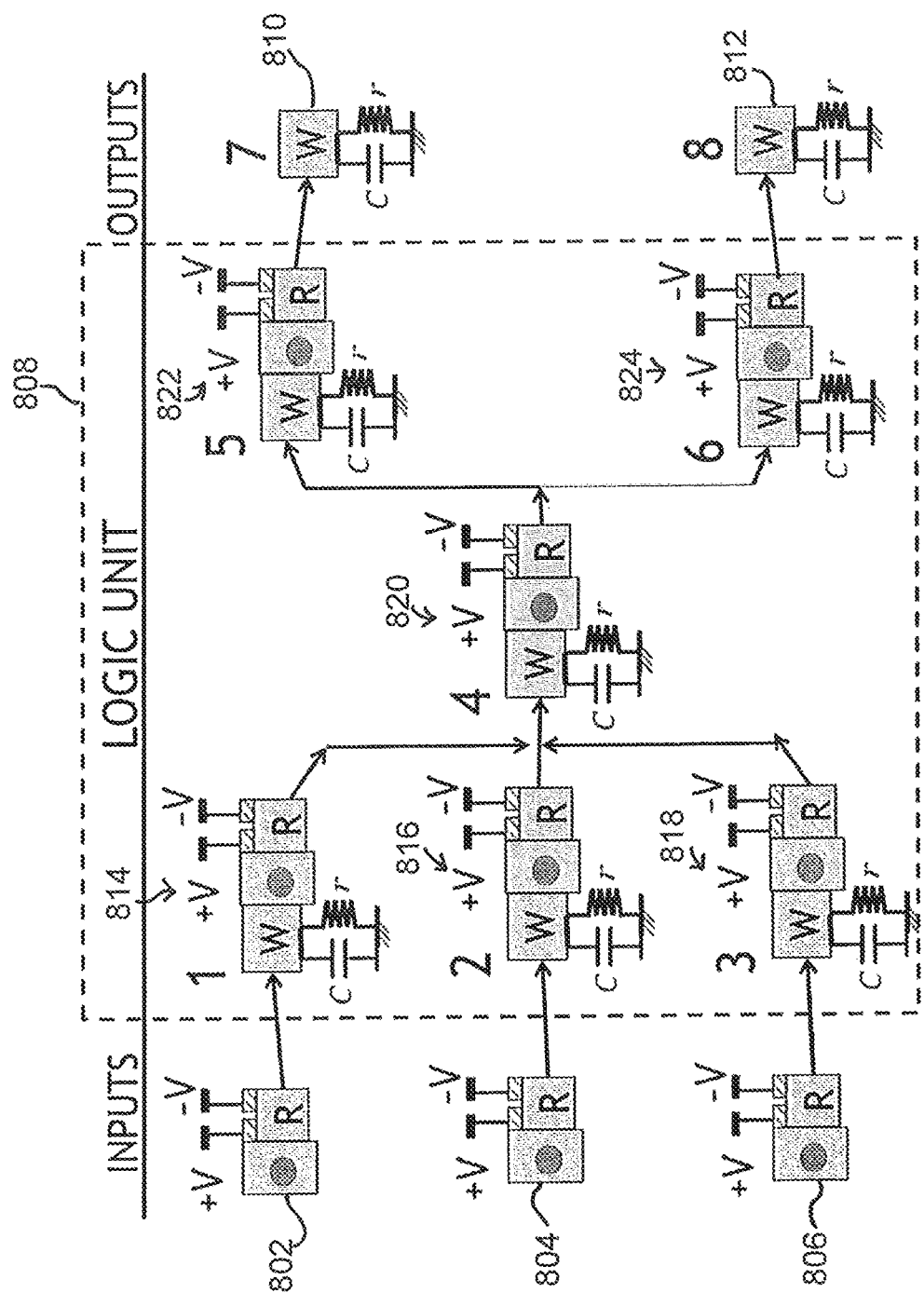
FIG. 10 shows a schematic diagram of a fourth embodiment of a circuit that includes a plurality of devices, each having a modification of the general design of the switch of FIG. 4.

Below a simulation illustrating the operation of a multistage Boolean gate constructed using the basic circuit devices 400 discussed above is provided. FIG. 10 shows, for example, a majority gate with three input devices 802, 804 and 806, a logic circuit 808, and two output devices 810, 812. The logic circuit 808 includes three first-stage devices 814, 816, 818 coupled to a second-stage device 820, which is in turn coupled to two third-stage devices 822 and 824. The input devices 802, 804, 806 may each suitably have the structure of a read unit 432 of FIG. 4, and the output devices 810, 812 may each suitably have the structure of the write unit 430 of FIG. 4. Each of the devices 814, 816, 818, 820, 822, and 824 may each suitably be a switch having the structure of the switch 400 of FIG. 4.

The first-stage devices 814, 816, 818 drive the second-stage device 820, which in turn drives the two third-stage devices 822 and 824. The two third-stage devices 822 and 824 drive the write unit output devices 810, 812. For generality, a capacitor C has been added in parallel with the resistor r in the write units of the devices 814, 816, 818, 820, 822, and 824.

Since this gate includes six switches/devices 814, 816, 818, 820, 822, and 824, each having a write and a read unit, the dynamics of twelve magnetization vectors $\hat{m}_{1W}$, $\hat{m}_{1R}$, . . . , $\hat{m}_{6W}$, $\hat{m}_{6R}$ described by LLG equations (Eq. (4)) need to be modeled. An expression is needed for the spin currents driving the different write units which are derived from the read units of the previous stage. Again, this relationship is similar to that of FIGS. 2 and 3. In addition there are spin currents driving the read units arising from the fixed magnets $\pm\hat{M}=\pm\hat{Z}$. These unwanted read spin currents affect the dynamics of the magnets, and the amplification associated with the SHE helps keep these small compared to the write spin currents.

Both the read and write spin currents can be determined using the equivalent circuit for a single read unit driving a single write unit (FIG. 3), redrawn here with the additional capacitor C. The Read spin current is obtained from the difference in the currents flowing through $G_1$ and $G_2$:

$$(\vec{I}_s)_{read} = \hat{Z}(G_1(V - Q/C) + G_2(V + Q/C)) = \hat{Z}(V G - \Delta G m_z Q/C) \quad (A1)$$

The total current flowing into the Write unit is the sum of the currents flowing through G1 and G2:

$$I = G_1(V - Q/C) - G_2(V + Q/C) = V\Delta G \overline{m_z} - \frac{Q}{C}G$$

However, this is true of a single Read unit driving a single Write unit. With $n_i$ identical Write units driving $n_o$ identical Read units the equivalent circuit is shown in FIG. 11, giving $$I = V\Delta G \frac{\overline{m_z}}{n_o} - \frac{Q}{C}G\frac{n_i}{n_o}$$

The Write spin current equals the amplification factor β times the charge current:

$$(\vec{I}_s)_{write} = \hat{z}\beta\left(V\Delta G \frac{\overline{m_z}}{n_o} - \frac{Q}{C}G\frac{n_i}{n_o}\right)$$

Figure 11:
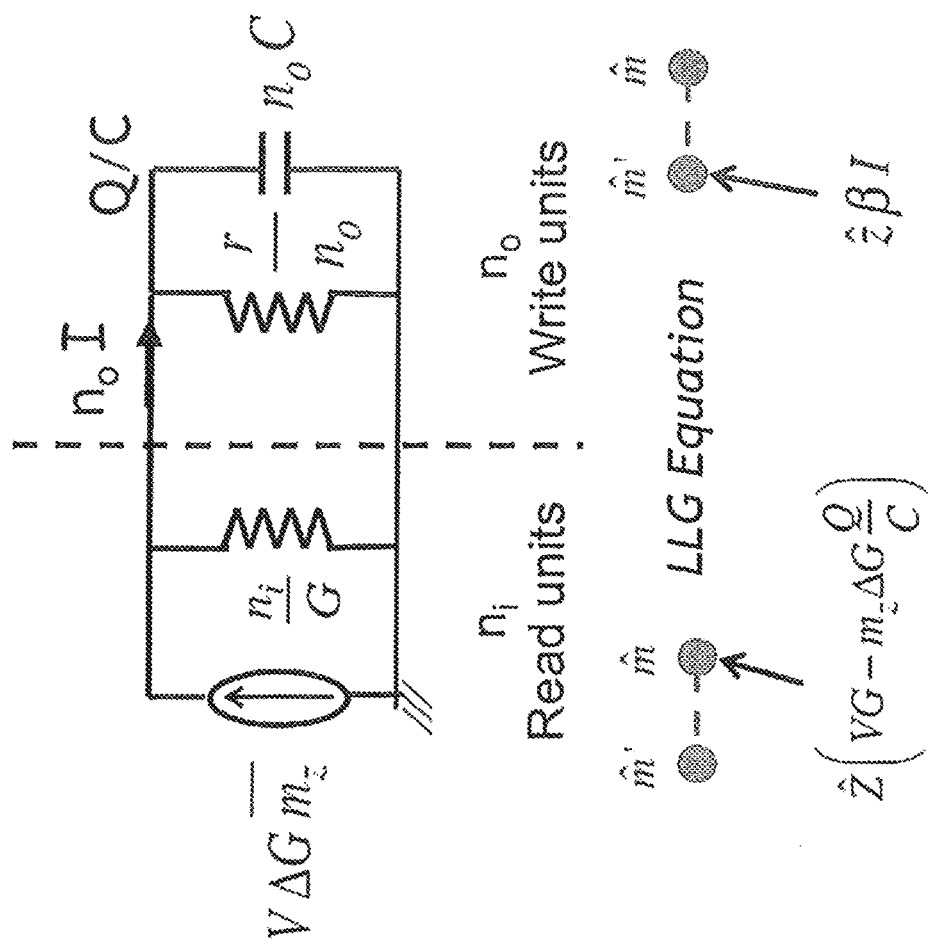
FIG. 11 is a schematic diagram of an equivalent circuit for at least a portion of the circuit of FIG. 10.

Finally the twelve LLG equations for the circuit of FIG. 10 need to be augmented for dm̂/dt with equations for dQ/dt for each of the eight capacitors, which are obtained readily from the equivalent circuit in FIG. 11:

$$\frac{dQ}{dt} = V\Delta G\frac{\overline{m_z}}{n_o} - \frac{Q}{C}\left(\frac{n_i G}{n_o} + \frac{1}{r}\right)$$

Following are some results obtained from the solution of 44 coupled first-order differential equations, 36 for the three components of the twelve magnetization vectors, and 8 for the charge on each capacitor. All W magnets were initialized in the −1 state while the Read magnets were initialized in the +1 state.

It is assumed that V∆G equal to $1.5q|\gamma|H_k/\beta$, with a TMR of 150% corresponding to ∆G/G=0.43. The time axis is normalized to $|\gamma|H_k/(1+\alpha^2)$ and the currents are normalized to $q|\gamma|H_k$.

Figure 12:
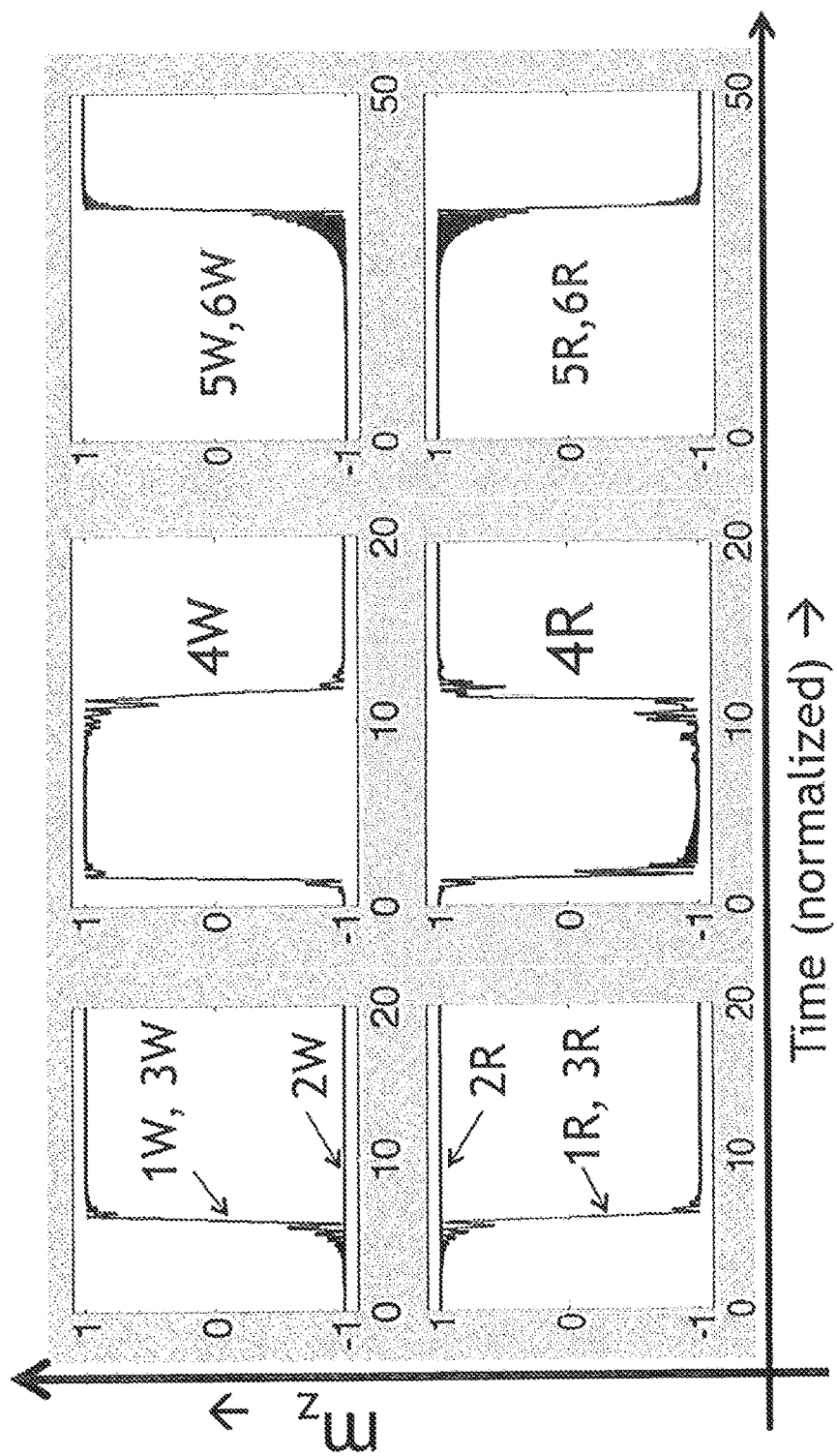
FIG. 12 is a first timing diagram illustrating the operation of the circuit of FIG. 10.

The three inputs were assumed to be +1, −1 and +1, causing both W and R magnets for 1 and 3 to change their states, while magnets 2W and 2R remain in their initial state (FIG. 12). Initially 4W switches to +1 (and 4R to −1) since 1R, 2R and 3R are all initialized to +1. But once 1R and 3R are switched to −1, 4W follows the majority and switches to −1, making 4R switch to +1.5W and 6W then follow 4R and switch to +1, making their dipole coupled partners 5R and 6R switch to −1.

Figure 13:
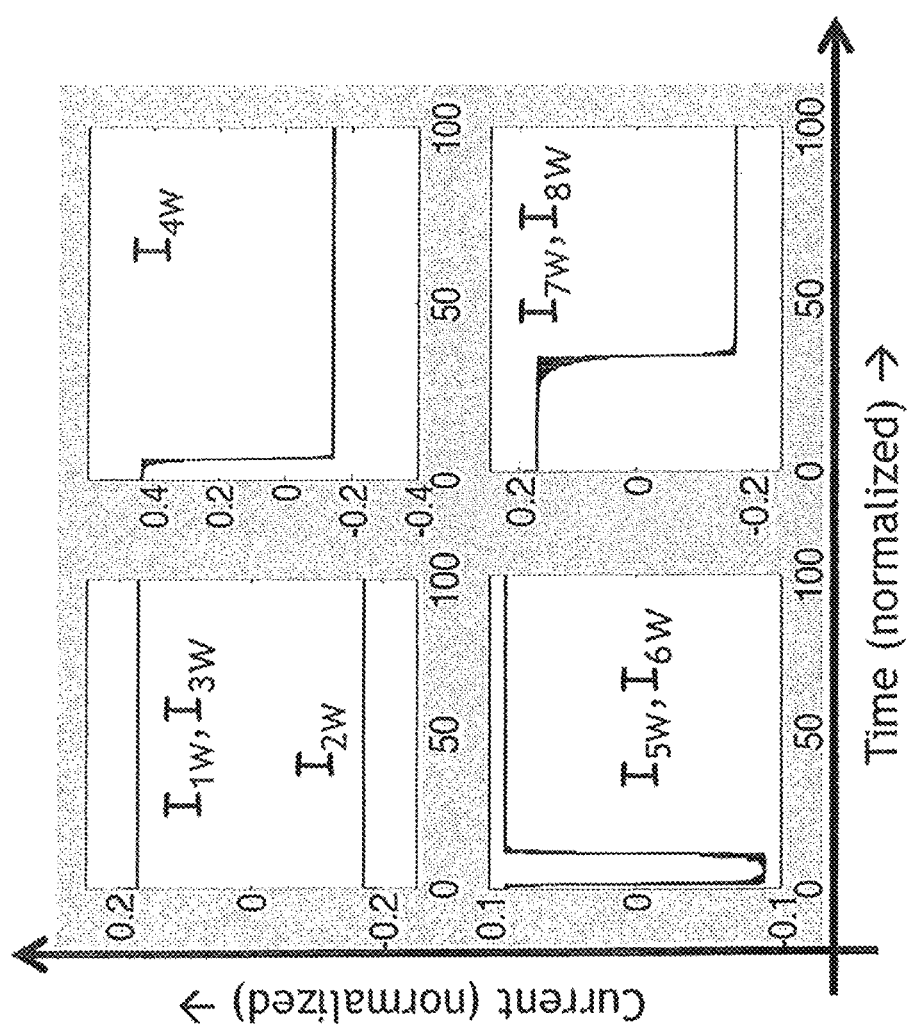
FIG. 13 is a second timing diagram illustrating the operation of the circuit of FIG. 10.

FIG. 13 shows the currents into each of the Write units with no evidence of any capacitor charging effects, because it is assumed r to be very small compared to 1/G (Gr=0.1). In this limit the results are not affected by the size of the capacitor which affects the charging time constant rC/(1+ Gr), assumed very short (0.02 in normalized units) in these simulations.

Figure 14:
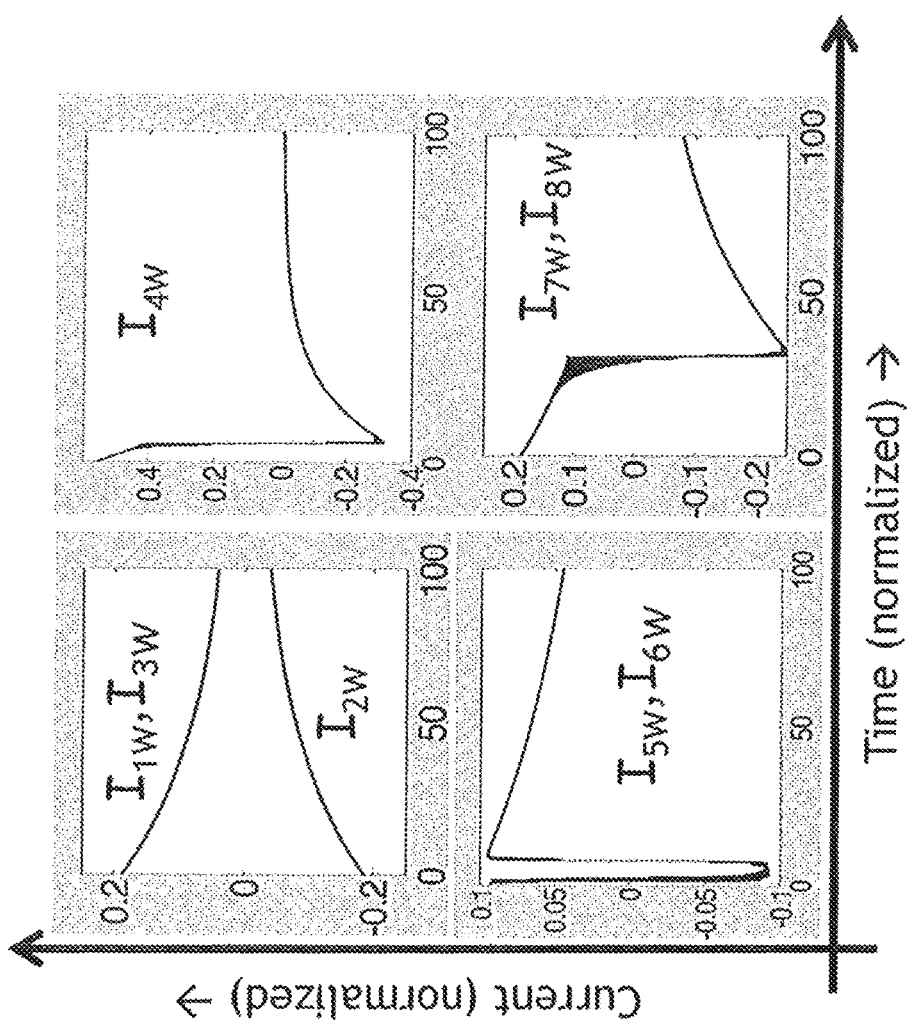
FIG. 14 is a third timing diagram illustrating the operation of the circuit of FIG. 10.

FIG. 14 shows the currents with Gr=10 and a longer time constant (50 in normalized units). The magnetization plots are not changed very much from those in FIG. 9 and are not shown. But the charging effects are now clearly evident in the currents which generally decay to a relatively small value. This feature may be useful in reducing the standby power.

Those skilled in the art will recognize that numerous modifications can be made to the specific implementations described above.

Referring now generally to FIGS. 15-20, the operation of a SS neural network for XOR classification is shown in a coupled LLG-based simulation. Spin switches (SS) such as those described above in connection with FIG. 4 can be interconnected with synapse weights that are adjusted through voltages conveniently stored in an underlying CMOS layer, with 3D stacking. Individual SS neurons/synapses occupy ~μm², consuming femtojoules per switching and operating at room temperature.

CMOS Versus Spin Switch (SS) for Neural Network:

CMOS neurons occupy hundreds to several thousands of μm² with power consumption around 50-100 μW and operate at few MHz. The energy consumed is ~tens of pJ. Typical spin switches (FIGS. 4, 15) size is ~0.01 μm², switching time is ~ns and switching energy ~10 fJ. A spin switch (SS) includes a Read and a Write unit that are electrically isolated but magnetically coupled, as shown in FIGS. 4 and 15. The Read unit uses two magnetic tunnel junctions (MTJ's) with fixed layers $\hat{M}$ and $-\hat{M}$ and a free magnet m̂. The Write unit consists of a giant spin Hall Effect (GSHE), such as: tantalum and a nanomagnet m̂' magnetically coupled to m̂ (for example, anti-ferromagnetic coupling). FIG. 15b shows the symbol to represent SS and FIG. 15c shows its input-output characteristics for two different values of the voltage V. Experimentally, Write/Read units operate at room temperature.

Referring specifically to FIG. 15a, FIG. 15(a) illustrates a physical structure of a vertically arranged embodiment 500 of the switch 400 of FIG. 4. In general, the Write and Read units are electrically isolated but magnetically coupled. Charge current $I_{in}$ controls (via the giant spin-Hall effect) the direction of magnet m̂' which in turn controls magnet m̂ via magnetic coupling (anti-parallel). $V_{OUT}$ is proportional to V m̂·M̂ (M̂ is the fixed magnet). FIG. 15(b) shows a Symbol used to denote a spin switch ("SS") such as that shown in FIG. 15(a), for example. FIG. 15(c) shows a SS input-output characteristic for V=$V_{th}$ (solid) and V=$V_{th}$/2 (dash) where $V_{th}$ is the threshold voltage (~100 mV) required to flip the magnet m̂'. SS: Area~100 nm×80 nm, switching time~ns and switching energy~10 fJ. Experimentally, both Write and Read units operate at room temperature. These properties make SS suitable for neuromorphic computation.

The SS 500 operates as follows: if charge current, $|I_{in}|>I_c$ (critical value), it produces enough spin current to flip the magnet m̂' hence m̂. The output voltage depends on the direction of m̂ via: Vout=V∆G/G(m̂·M̂) where G, ∆G are the sum and the difference of the conductance $G_P$, $G_{AP}$ (parallel and anti-parallel) of the MTJ's respectively. The power P can be estimated as:

$$P \approx V^2(G_{AP}+G_P) = V^2 G \sim 10 \text{ μW, for } V=V_{th} \approx 100 \text{ mV}, G = (1.1 \text{ kΩ})^{-1}.$$

Note that the SS 500 does not involve any crystalline materials and it should be possible to stack in 3D making it suitable for very high density neuromorphic computation [5].

Figure 16:
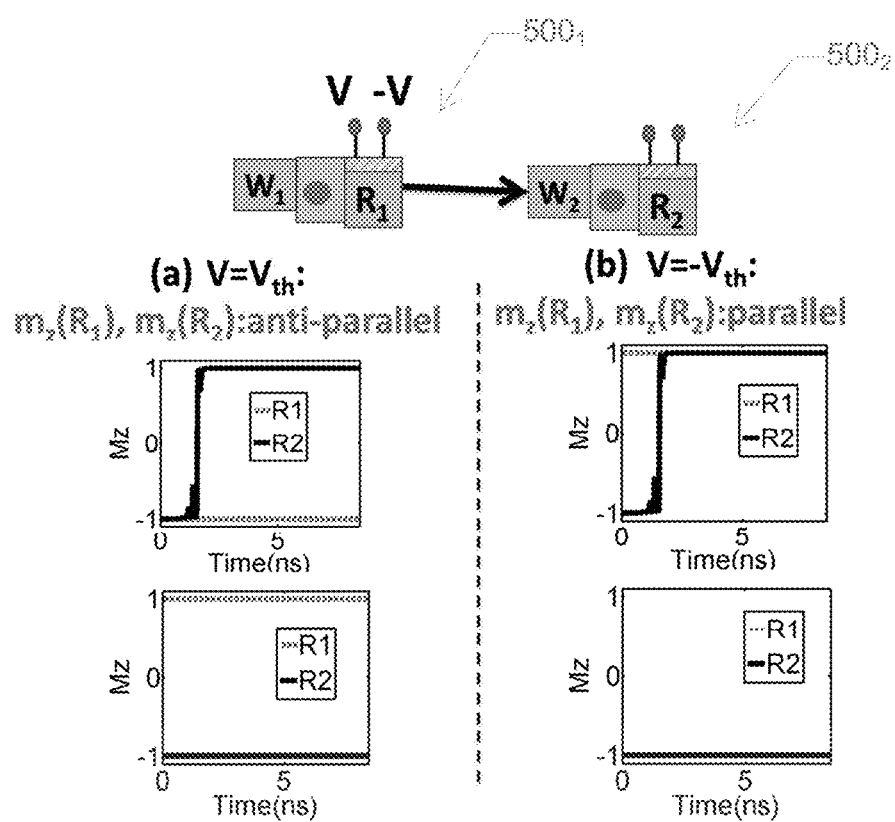

FIG. 16 shows simulations of two spin switches 500$_1$ and 500$_2$ as a natural compact synapse: LLG-based simulations for the z component (easy axis) of free magnet $R_2$, $m_z$ ($R_2$) of the switch 500$_2$, controlled by the voltage V applied at $R_1$ of the switch 500$_1$. In (a): V=V$_{th}$, $m_z$ ($R_1$) dictates an inhibitory (anti-parallel) interaction to m($R_2$). In (b): V=V$_{th}$, the interaction is exhibitory (parallel). In general, $\hat{m}_z$ ($R_2$) $\propto -V \hat{m}_z$ ($R_1$). In the neural network context, $V_s$ is considered as the weight of neuron 1 on neuron 2. Voltage weighting provides a convenient way for adjusting its value for on-chip training.

SS for Synapses:

Thus, FIG. 16 shows the basic unidirectional interaction between two spin switches 500$_1$ and 500$_2$ which makes a natural synapse. "Neuron" $R_1$ can provide an inhibitory (a) or an exhibitory (b) connection to neuron $R_2$ depending on the weight voltage V. This can be understood by noticing that the output current from $R_1$ is $\propto V\hat{m}_z$ ($R_1$) [1] forcing $\hat{m}_z(W_2)$ into the same direction with it. Here z denotes the easy axis of magnet. Since $\hat{m}_z(W_2) = -\hat{m}_z(R_2) \rightarrow \hat{m}_z(R_2) \propto -V \hat{m}_z(R_1)$. Voltage weight provides a convenient way of adjusting its values for both off-line and on-chip training.

Figure 17:
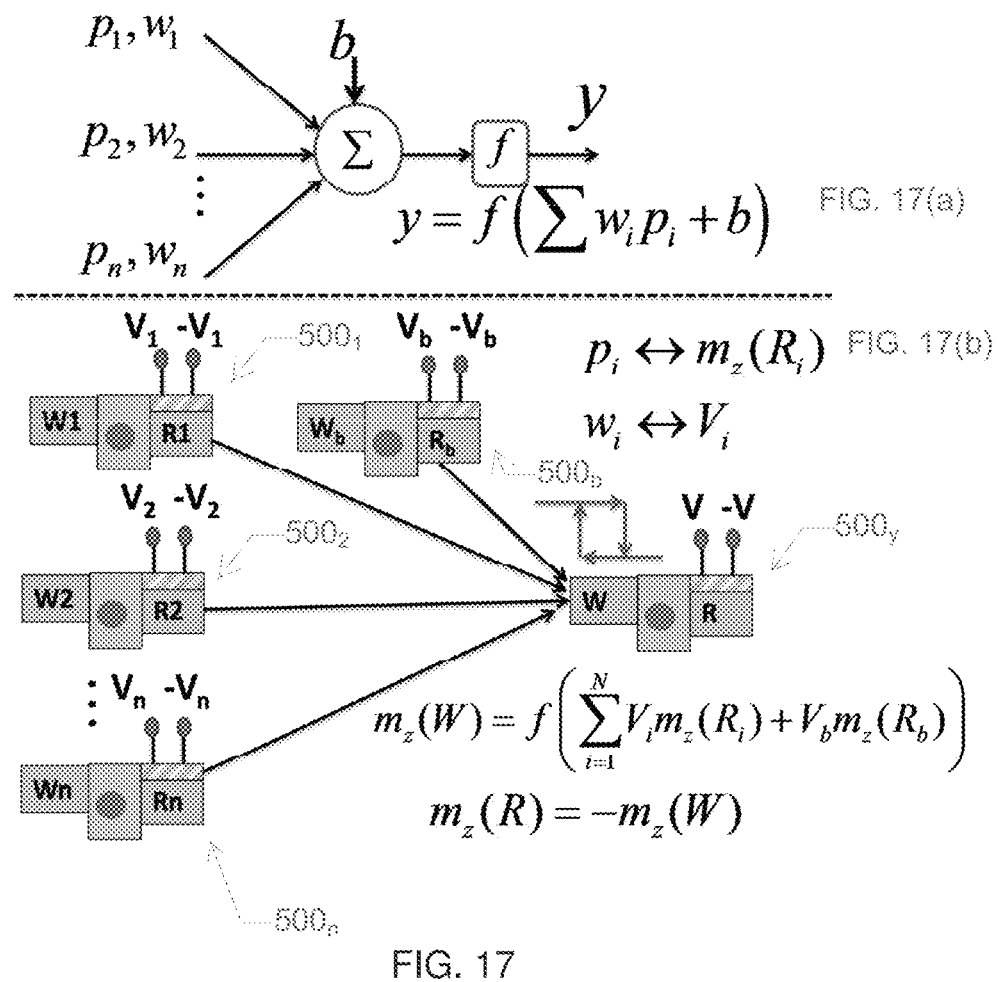
FIG. 17 shows a schematic diagram of a compact neuron circuit employing a plurality of switching devices.

FIG. 17 illustrates a SS as also a natural compact neuron: FIG. 17(a) illustrates a schematic of a neuron that takes the incoming signal $p_i$ with associate weight $w_i$ and generates the output according to the activation function $f$. FIG. 17(b) shows a SS neuron formed by the switch 500$_y$ configured with other switches 500$_1$-500$_n$ and 500$_b$ to carry out the operations of FIG. 17 (a). The state of the neuron switch 500$_y$ is the direction of free magnet $m_z(R)$. The switch 500$_y$ has incoming signals $m_z(R_i)$ and weight voltage $V_i$ from the switches 500$_1$-500$_n$. The switch 500$_b$ represents a biasing factor often used in neural networks, which is implemented mathematically as shown in FIG. 17(a). The switch 500$_y$ has a built-in "summing circuit" and also a built-in hysteresis activation function due to the property of the magnet. In CMOS-based neurons, each of these functions usually requires additional circuits. SS neuron, therefore, is suitable for very high density computation.

More specifically, FIG. 17a shows the basic operational principle of a model neuron which receives the signal $p_i$ with weight $w_i$ from other neurons and integrates them. The model neuron also factors in a bias factor b. The weighted sum signal is then passed to an activation function $f$ determining the output of the neuron. FIG. 17b describes a hardware implementation of the SS neuron 500$_y$ with similar operational principles. The incoming signals are represented by the z component of free magnet $m_z$ ($R_i$) of the input switch 500$_i$ and the voltage $V_i$ is the weight of that signal. The weighted sum current at the W unit:

$$I = \left(\sum_i V_i \Delta G_i m_z(R_i)\right) \bigg/ \left(1 + r \sum_i G_i\right)$$

where r is the resistance of the W unit. Typically $G_i \sim (1 \text{ kΩ})^{-1}$ and we would like to make r small enough so that we can ignore the currents going from one SS to other SS. Using t=2 nm, L=80 nm and the resistivity of Ta [4], r=ρL/Wt=80Ω/W(μm). The SS neuron 500$_s$ has an intrinsic hysteresis activation function (FIG. 17b) arising from the properties of the magnet. The advantages of a hysteresis function and the associated non-volatility are known.

Training the Network:

Off-line training can be performed by smoothing the SS hysteresis function to make it differentiable and adapting known back-propagation (BP) methods. Alternatively, a weight perturbation (WP) method can handle non-differentiable activation functions and is suitable for hardware implementations and on-chip learning. Other possibilities include the extreme learning machine.

Figure 18:
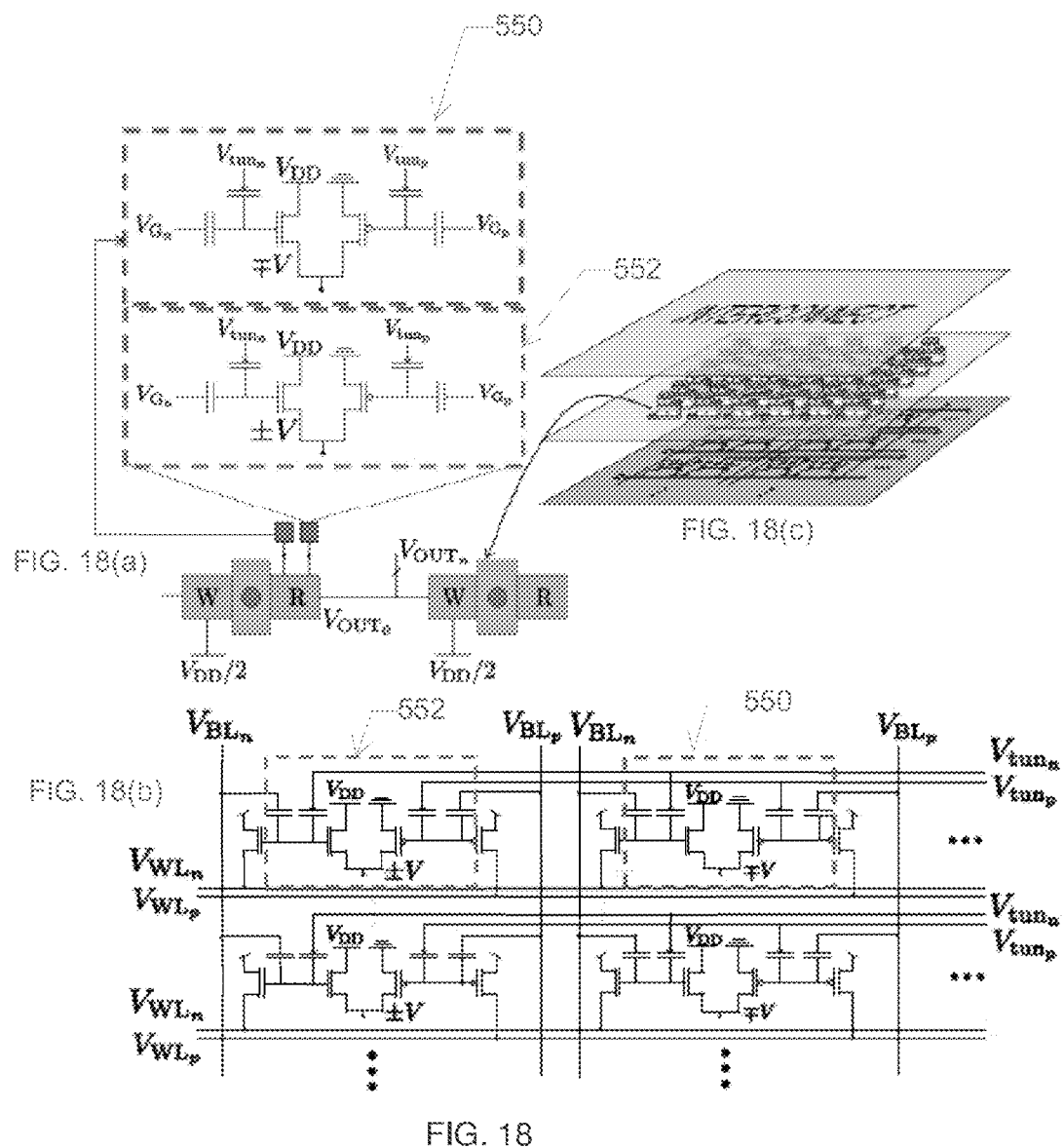

Once the weights have been determined using any of these methods they can be implemented through the voltages applied to the SS synapses, as we will show shortly with an example. FIG. 18 shows how these weighting voltages can be adjusted/stored using floating gate low drop out voltage regulator.

In particular, FIG. 18 shows a arrangement for supplying/storing long term voltage for weights according to a further embodiment. As shown in FIG. 18(a), the weights (+/−V) of the dual-pillar MTJ stack are provided through the use of tunable complementary floating-gate low drop out voltage regulators (shown here as regulators 550, 552). The FET devices are pass gates operating in saturation. Channel Hot Electron Injection and Fowler-Nordheim tunneling modulated by V$_G$, V$_{tun}$ can be used to adjust the charge trapped on the floating gate. In turn, those charges adjust the effective threshold of the nFET/pFET devices giving +/−V at each MTJ of the R unit. As shown in FIG. 18(b), each floating-gate may be formed in a bit-addressable array for individual nFET/pFET charge (threshold) tuning. As shown in FIG. 18(c), The spin-switch layer is preferably formed in the metallization above the silicon layer along with the interconnect for the neural network.

SS Neural Network:

FIG. 19a shows a schematic of a well-known XOR classification problem in which any number in a 2D plane having a coordinate P(x,y) where −1<x<1 and −1<y<1 is classified as a class A or class B depending on which quadrant it belongs to. FIG. 19b depicts a SS neural network (NN) implementation with voltage weighting designed to solve the problem. Weight $w_{ij}$ between neuron i and j is determined by the voltage applied at a SS connecting them. FIG. 19c tabulates the voltage weights that need to be applied at each neuron SS and at each synapse SS.

More specifically, FIG. 19a shows a SS neural network for a XOR classification problem. FIG. 19(a) shows a schematic, and FIG. 19(b) shows a spin switch implementation of the schematic. R1 to R4 (or R5 to R8) in the input layer is a 4-bit code representing the value of x(or y). Hidden and output neurons are labeled from 1 to 5. The synapses are SS represented by circles attached by weight voltage. FIG. 19(c) shows tables of the normalized voltages and bias currents needed at each neuron and synapse. Those values can be obtained through the back-propagation (by smoothing out the hysteresis activation function) or weight perturbation method. Neuron voltages are represented by V$_i$, while V$_{ji}$ represents the voltage applied at the synapse connecting neuron i and j.

Figure 20A:
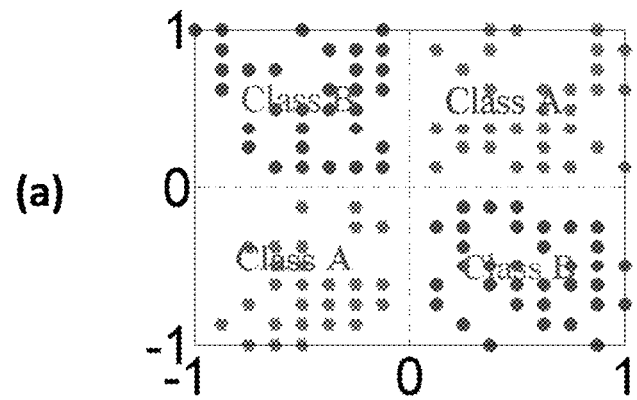
FIG. 20a shows a simulation of a neural network.
Figure 20B:
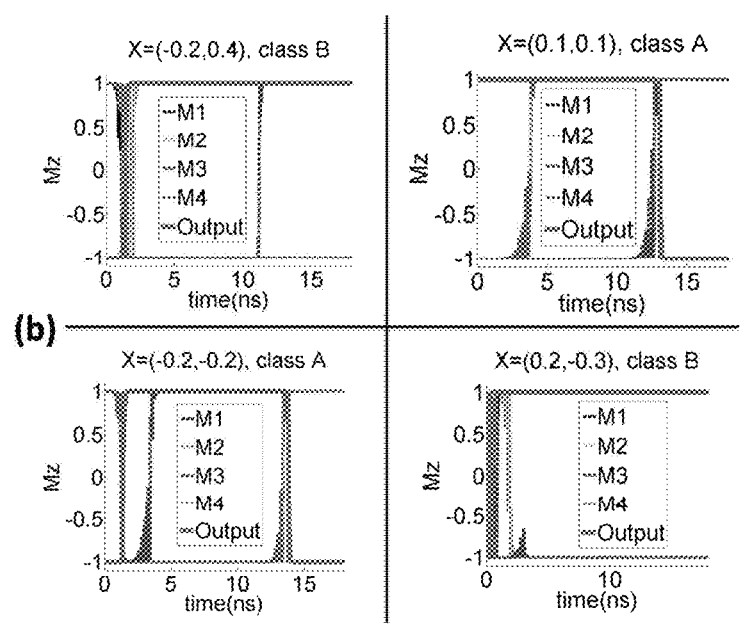

FIG. 20a proves the ability of SS for NN by showing the results from standard Landau-Lifshitz-Gilbert (LLG) equation-based simulation, using 50 coupled LLG's, one for each magnet (two per spin switch) in the network shown in FIG. 19b. FIG. 20b shows the dynamics of the network as it responds to inputs of class A and B.

Specifically, FIG. 20a shows a simulation of SS neural network in FIG. 19(b) using 50 coupled LLG equations, one for each magnet: a) Results for XOR classification with random inputs. b) Example of the dynamics of the outputs responding to four inputs falling in four different quadrants. Here M1, M2 . . . M4 are the magnetizations (R units) of neurons in the hidden layers. All the neuron states in the hidden layers are randomized initially. The classification process happens, on average, in under 10 ns.

We claim:

1. A circuit element, comprising:
a first nanomagnet inductively coupled to a first current carrying element, the first nanomagnet configured to change polarity responsive to current in the first current carrying element;
a second nanomagnet magnetically coupled to the first nanomagnet and inductively coupled to a second current carrying element;
a first fixed magnet disposed on the second nanomagnet and having a first fixed magnetic polarity;
a second fixed magnet disposed on the second nanomagnet and having a second fixed magnetic polarity opposite to the first fixed magnetic polarity; and
a weighting circuit operably coupled to the first fixed magnet and the second fixed magnet to provide a first voltage to the first fixed magnet and a second voltage to the second fixed magnet, the first and second voltages having opposite electrical polarities.

2. The circuit element of claim 1, wherein the weighting circuit includes a floating gate voltage regulator.

3. The circuit element of claim 1, wherein the weighting circuit is formed in a semiconductor layer of a device, and the first nanomagnet and second nanomagnet are formed in a metallization layer of the device.

4. The circuit element of claim 1, further comprising an input coupled to the first current carrying element, and an output coupled to the second current carrying element.

5. The circuit element of claim 1, wherein the first current carrying element comprises a giant spin Hall effect material.

6. The circuit element of claim 1, wherein the first nanomagnet is constructed of CoFeB.

7. The circuit element of claim 1, further comprising an oxide layer disposed between the first fixed magnet and the second nanomagnet, the oxide layer being further disposed between the second fixed magnet and the second nanomagnet.

8. The circuit element of claim 7, wherein the first fixed magnet and the oxide layer cooperate to form a first magnetic tunnel junction when the first voltage is applied to the first fixed magnet, and wherein the second fixed magnet and the oxide layer cooperate to form a second magnetic tunnel junction when the second voltage is applied to the second fixed magnet.

9. The circuit element of claim 1, wherein the second current carrying element is disposed at least in part between the first nanomagnet and the second nanomagnet, and further comprising an insulating layer disposed between the second current carrying element and the first nanomagnet.

10. A plurality of circuit elements including a first circuit element and a first group of at least two circuit elements, each circuit element comprising:
at least a first nanomagnet inductively coupled to a first current carrying element, the first nanomagnet configured to change polarity responsive to current in the first current carrying element;
at least a second nanomagnet magnetically coupled to the first nanomagnet and inductively coupled to a second current carrying element;
at least a first fixed magnet disposed on the second nanomagnet and having a first fixed magnetic polarity; and
at least a second fixed magnet disposed on the second nanomagnet and having a second fixed magnetic polarity opposite to the first fixed magnetic polarity;
wherein the first circuit element includes an input coupled to its first current carrying element, each of the first group of circuit elements includes an output coupled to its respective second current carrying element, each output operably coupled to the input of the first circuit element.

11. The plurality of circuit elements of claim 10, wherein the first circuit element includes a plurality of first nanomagnets magnetically coupled to a plurality of second nanomagnets.

12. The plurality of circuit elements of claim 11, wherein at least some of the plurality of first nanomagnets are operably coupled to receive different weighted currents from the output of a first of the first group of circuit elements.

13. The plurality of circuit elements of claim 10, wherein each of the first group of circuit elements includes a plurality of first nanomagnets magnetically coupled to a plurality of second nanomagnets.

14. The plurality of circuit elements of claim 10, further comprising a weighting circuit operably coupled to the first fixed magnet and the second fixed magnet to provide a first voltage to the first fixed magnet and a second voltage to the second fixed magnet, the first and second voltages having opposite electrical polarities.

15. The plurality of circuit elements of claim 14, wherein the weighting circuit includes a floating gate voltage regulator.

16. The plurality of circuit elements of claim 10, wherein the second current carrying element of each circuit element further comprises a current carrying layer disposed between the first nanomagnet and the second nanomagnet, and each circuit element further comprises an insulating layer disposed between the current carrying layer and the first nanomagnet.

17. The plurality of circuit elements of claim 16, wherein each circuit element further comprises an oxide layer disposed between the first fixed magnet and the second nanomagnet, the oxide layer being further disposed between the second fixed magnet and the second nanomagnet.

18. The plurality of circuit elements of claim 17, wherein the first fixed magnet and the oxide layer cooperate to form a first magnetic tunnel junction when a first voltage is applied to the first fixed magnet, and wherein the second fixed magnet and the oxide layer cooperate to form a second magnetic tunnel junction when a second voltage is applied to the second fixed magnet.

19. The plurality of circuit elements of claim 16, wherein the first current carrying element comprises a giant spin Hall effect material.

20. The plurality of circuit elements of claim 14, wherein the weighting circuit is formed in a semiconductor layer of a device, and the first nanomagnet and second nanomagnet are formed in a metallization layer of the device.

* * * * *